(12) United States Patent
Bae et al.

(10) Patent No.: US 9,874,982 B2
(45) Date of Patent: Jan. 23, 2018

(54) TOUCH PANELS AND METHODS OF MANUFACTURING TOUCH PANELS

(71) Applicant: Samsung Display Co., Ltd., Yongin (KR)

(72) Inventors: Joo-Han Bae, Seongnam-si (KR); Sung-Ku Kang, Suwon-si (KR); Jin-Hwan Kim, Seoul (KR); Hee-Woong Park, Hwaseong-si (KR); Byeong-Kyu Jeon, Busan (KR)

(73) Assignee: Samsung Display Co., Ltd., Yongin-si (KR)

( * ) Notice: Subject to any disclaimer, the term of this patent is extended or adjusted under 35 U.S.C. 154(b) by 425 days.

(21) Appl. No.: 14/502,512

(22) Filed: Sep. 30, 2014

(65) Prior Publication Data

US 2015/0101919 A1  Apr. 16, 2015

(30) Foreign Application Priority Data

Oct. 15, 2013  (KR) .................. 10-2013-0122657

(51) Int. Cl.
| | | |
|---|---|---|
| *H03K 17/96* | (2006.01) | |
| *G06F 3/041* | (2006.01) | |
| *G06F 3/044* | (2006.01) | |
| *H05K 1/02* | (2006.01) | |

(Continued)

(52) U.S. Cl.
CPC .... *G06F 3/044* (2013.01); *G06F 2203/04103* (2013.01); *G06F 2203/04111* (2013.01); *H03K 2217/96015* (2013.01); *H05K 1/0289* (2013.01); *H05K 1/0306* (2013.01); *H05K 1/0313* (2013.01); *H05K 1/09* (2013.01); *H05K 2201/0108* (2013.01)

(58) Field of Classification Search
None
See application file for complete search history.

(56) References Cited

U.S. PATENT DOCUMENTS

| | | | |
|---|---|---|---|
| 2010/0295819 A1 | 11/2010 | Ozeki et al. | |
| 2012/0193624 A1* | 8/2012 | You ...................... | H01L 27/124 257/57 |
| 2012/0262385 A1 | 10/2012 | Kim et al. | |

(Continued)

FOREIGN PATENT DOCUMENTS

| | | |
|---|---|---|
| JP | 2010-271796 | 12/2010 |
| KR | 10-2012-0008153 | 1/2012 |

(Continued)

*Primary Examiner* — Seahvosh Nikmanesh
*Assistant Examiner* — Xiaoming Liu
(74) *Attorney, Agent, or Firm* — H.C. Park & Associates, PLC

(57) ABSTRACT

An exemplary embodiment of the present invention discloses a method of manufacturing a touch panel, the method including, forming a plurality of sensing cells in a first region of a substrate, forming an insulating interlayer on the plurality of sensing cells, removing at least a portion of the insulating interlayer to form contact holes exposing the plurality of sensing cells, and forming a connection pattern and a transparent conductive pattern on the insulating interlayer simultaneously, wherein the connection pattern is electrically connected to adjacent sensing cells, and the transparent conductive pattern is disposed in a second region of the substrate outside of the first region.

10 Claims, 27 Drawing Sheets

(51) Int. Cl.
*H05K 1/03* (2006.01)
*H05K 1/09* (2006.01)

(56) References Cited

U.S. PATENT DOCUMENTS

| | | | | |
|---|---|---|---|---|
| 2013/0168138 A1* | 7/2013 | Yamazaki | ............ | H05K 1/0296 174/253 |
| 2015/0042903 A1* | 2/2015 | Misaki | .................... | G06F 3/044 349/12 |

FOREIGN PATENT DOCUMENTS

| | | |
|---|---|---|
| KR | 101114031 | 2/2012 |
| KR | 10-2012-0075982 | 7/2012 |
| KR | 101169250 | 8/2012 |
| KR | 10-2012-0116225 | 10/2012 |
| KR | 101357585 | 2/2014 |

* cited by examiner

TOUCH PANELS AND METHODS OF MANUFACTURING TOUCH PANELS

CROSS REFERENCE TO RELATED APPLICATION

This application claims priority from and the benefit of Korean Patent Application No. 10-2013-0122657 filed on Oct. 15, 2013, which is hereby incorporated by reference for all purposes as if fully set forth herein.

BACKGROUND

Field

Exemplary embodiments of the present invention relate to touch panels and methods of manufacturing touch panels. More particularly, exemplary embodiments relate to touch panel having an improved reliability and methods of manufacturing the same.

Discussion of the Background

A touch panel has been developed as an input device capable of inputting information by converting a touch of an object into an electrical signal. The touch panel may be classified into a resistive type touch panel, a capacitive type touch panel, an electromagnetic type touch panel, a surface acoustic wave (SAW) type touch panel, and an infrared type touch panel. Currently, the capacitive type touch panel has been prominently used in a wide range of fields due to a resolution difference, electrical characteristics, and durability.

The touch panel employed in a display device such as an organic light emitting display (OLED) device or a liquid crystal display (LCD) device may generally recognize a contact position of the hand of a user or an object though touch sensors thereof. As flexible display device has been studied, a touch panel having improved durability and reliability has been researched, when touch panel is bent.

The above information disclosed in this Background section is only for enhancement of understanding of the background of the invention and therefore it may contain information that does not form any part of the prior art nor what the prior art may suggest to a person of ordinary skill in the art.

SUMMARY

Exemplary embodiments of the present invention provide a touch panel having an improved reliability.

Exemplary embodiments of the present invention also provide a method of manufacturing a touch panel having an improved reliability.

Additional features of the invention will be set forth in the description which follows, and in part will be apparent from the description, or may be learned by practice of the invention.

An exemplary embodiment of the present invention discloses a method of manufacturing a touch panel, the method including, forming a plurality of sensing cells in a first region of a substrate, forming an insulating interlayer on the plurality of sensing cells, removing at least a portion of the insulating interlayer to form contact holes exposing the plurality of sensing cells, and forming a connection pattern and a transparent conductive pattern on the insulating interlayer simultaneously, wherein the connection pattern is electrically connected to adjacent sensing cells, and the transparent conductive pattern is disposed in a second region of the substrate outside of the first region.

An exemplary embodiment of the present invention also discloses a touch panel including, a substrate including a first region and a second region, a plurality of sensing cells disposed in the first region, a pad portion disposed in the second region, an insulating interlayer disposed on the plurality of sensing cells, a connection pattern disposed on the insulating interlayer, the connection pattern being electrically connected to adjacent sensing cells through contact holes, and a transparent conductive pattern disposed in the second region and on the insulating interlayer, the transparent conductive pattern being electrically connected to the plurality of sensing cells and the pad portion.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
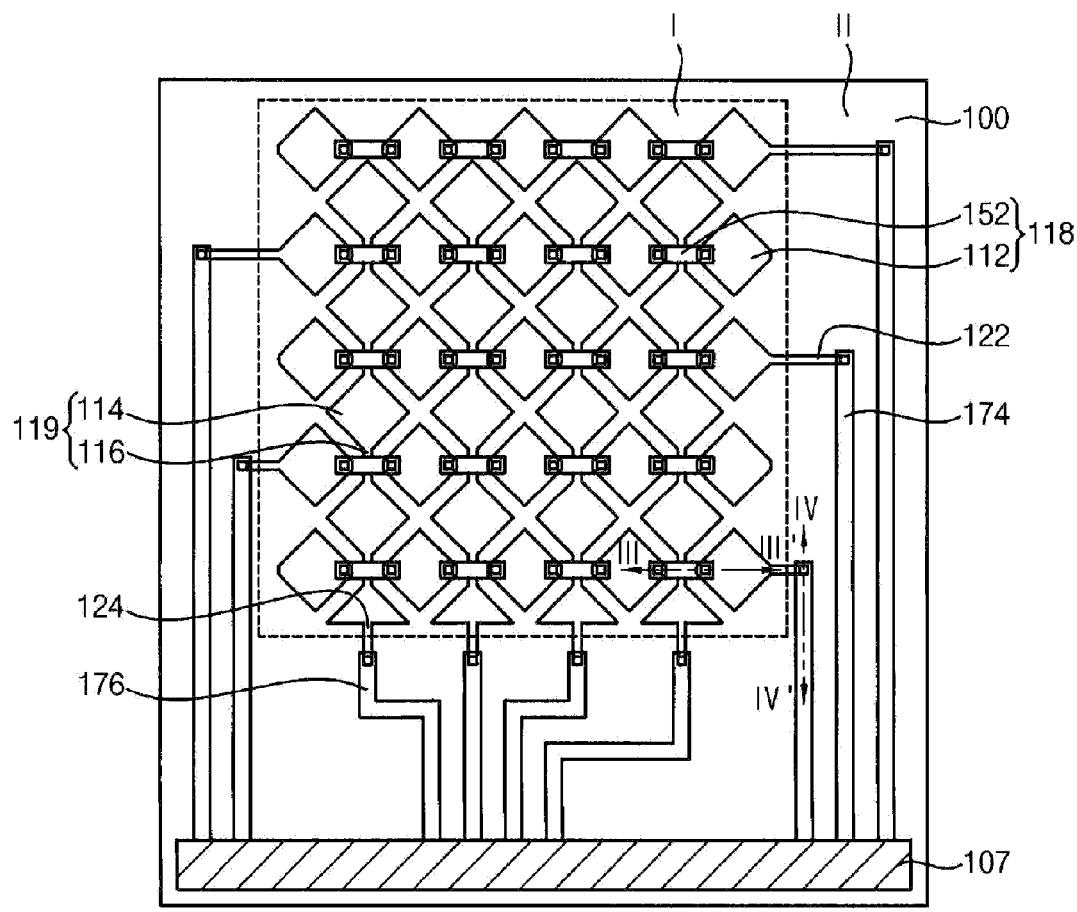
FIG. 1 is a plan view illustrating a touch panel in accordance with exemplary embodiments.
Figure 1:
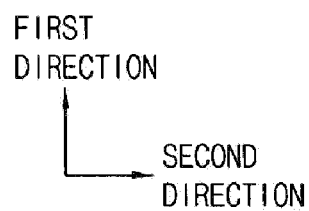

The exemplary embodiments are described more fully hereinafter with reference to the accompanying drawings. The invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like or similar reference numerals refer to like or similar elements throughout. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of exemplary embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross sectional illustrations that are schematic illustrations of illustratively idealized exemplary embodiments (and intermediate structures) of the invention. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
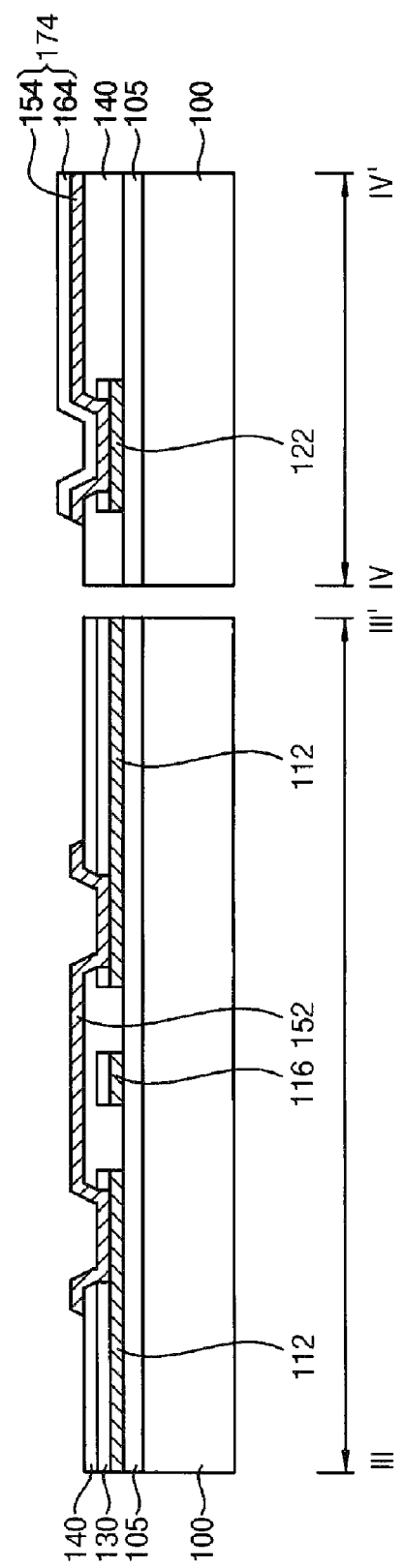
FIG. 2 is the cross sectional view illustrating a touch panel of FIG. 1 in accordance with exemplary embodiments.

FIG. 1 is a plan view illustrating a touch panel in accordance with exemplary embodiments, and FIG. 2 is a cross sectional view illustrating the touch panel of FIG. 1 in accordance with exemplary embodiments. FIG. 2 includes cross sectional views cut along line III-III' and line IV-IV' in FIG. 1.

Referring to FIGS. 1 and 2, the touch panel in accordance with exemplary embodiments may include a substrate 100, a first sensing electrode 118, a second sensing electrode 119, a first wiring 174, a second wiring 176, and a pad portion 107.

The substrate 100 may include a transparent insulation substrate. For example, the substrate 100 may include a glass substrate, a quartz substrate, a transparent resin substrate, etc. The substrate 100 may be divided into a first region I and a second region II. In exemplary embodiments, the first region I may be a sensing region in which the sensing electrodes 118 and 119 may be located, and the second region II may be a peripheral region in which the wirings 174 and 176, and the pad portion 107 may be located. For example, the second region II may surround at least one side of the first region I.

A buffer layer 105 may be disposed on the substrate 100. For example, the buffer layer 105 may include a transparent resin such as polycarbonate-based resin. Alternatively, when the substrate 100 includes the transparent resin substrate, the buffer layer 105 may be omitted.

A plurality of first sensing electrodes 118 and a plurality of second sensing electrodes 119 may be disposed in the first region I on the substrate 100. In exemplary embodiments, the plurality of first sensing electrodes 118 may be arranged in a first direction, and each of the first sensing electrodes 118 may extend in a second direction substantially perpendicular to the first direction. In this exemplary embodiment, the plurality of second sensing electrodes 119 may be arranged in the second direction, and each of the second sensing electrodes 119 may extend in the first direction.

Each of the first sensing electrodes 118 may include a plurality of first sensing cells 112 and a plurality of first connection patterns 152. In exemplary embodiments, each of the first connection patterns 152 may connect the first sensing cells 112 in the second direction.

Each of the second sensing electrodes 119 may include a plurality of second sensing cells 114 and a plurality of second connection patterns 116. In exemplary embodiments, each of the second connection patterns 116 may connect the second sensing cells 114 in the first direction.

A first wiring connection pattern 122 and a second wiring connection pattern 124 may be disposed in the second region II on the buffer layer 105. In exemplary embodiments, the first wiring connection pattern 122 may be electrically connected to the first sensing electrode 118, and the second wiring connection pattern 124 may be electrically connected to the second sensing electrode 119.

In this exemplary embodiment, the first sensing cells 112, the second sensing cells 114, the second connection pattern 116, the first wiring connection pattern 122, and the second wiring connection pattern 124 may be disposed on the buffer layer 106. Particularly, the second sensing cells 114, the second connection pattern 116, and the second wiring connection pattern 124 may be integrally formed as illustrated in FIG. 1. In exemplary embodiments, the first sensing cells 112, the second sensing cells 114, the second connection pattern 116, the first wiring connection pattern 122, and the second wiring connection pattern 124 may include a plurality of metal nanowires. The plurality of metal nanowires may be arranged in a predetermined direction or may be arranged to form an irregular network.

In exemplary embodiments, the metal nanowires may have a width of about 10 nm to about 50 nm, and may have a length of about 1 μm to about 10 μm. For example, the metal nanowires may include Ag nanowires. The metal nanowires may have a relatively large length, and may be arranged to form the network, so that the first sensing cells 112, the second sensing cells 114, the second connection pattern 116, the first wiring connection pattern 122, and the second wiring connection pattern 124 may have a relatively small electrical resistance and a relatively high light transmittance. Further, the metal nanowires may have a relatively large ductility, so that even when the touch panel is bent, the second sensing cells 114, the second connection pattern 116, the first wiring connection pattern 122, and the second wiring connection pattern 124 may not be broken.

The first insulating interlayer 130 may be disposed on the first sensing cells 112, the second sensing cells 114, the second connection pattern 116, the first wiring connection pattern 122, and the second wiring connection pattern 124. For example, the first insulating interlayer 130 may include a transparent resin such as acryl-based resin. The transparent resin may be disposed not only on top surfaces of the first sensing cells 112, the second sensing cells 114, the second connection pattern 116, the first wiring connection pattern 122, and the second wiring connection pattern 124, but also at an empty space between the metal nanowires. Therefore, the first insulating interlayer 130 may protect and hold the metal nanowires.

The second insulating interlayer 140 may be disposed to cover the first insulating interlayer 130. The second insulating interlayer 140 may include a transparent resin such as acryl-based resin. The second insulating interlayer 140 may protect the first sensing cell 112, etc. from an etching solution during an etching process for forming a contact holes which will be described as follow.

Referring now to FIG. 2, the first connection pattern 152 may be electrically connected to the adjacent first sensing cells 112 through the contact holes. The first connection pattern 152 may overlap the second connection pattern 116, when viewed in a direction perpendicular to a top surface of the substrate 100. However, the first connection pattern 152 and the second connection pattern 116 may be electrically isolated from each other by the second insulating interlayer 140.

The first connection pattern 152 may include a transparent conductive material such as indium zinc oxide (IZO) or indium tin oxide (ITO). Therefore, the first connection pattern 152 may have a relatively small electrical resistance and a relatively high light transmittance.

Further, the first wiring 174 and the second wiring 176 may be disposed on the second insulating interlayer 140. The first wiring 174 and the second wiring 176 may be electrically connected to the first wiring connection pattern 122 and the second wiring connection pattern 124, respectively, by the contact holes penetrating the second insulating interlayer 140 and the first insulating interlayer 130. That is, the first wiring 174 may electrically connect the first sensing cells 118 with the pad portion 107, and the second wiring 176 may electrically connect the second sensing cells 119 with the pad portion 107. The first wiring 174 and the second wiring 176 may be disposed on the second insulating interlayer 140 including the transparent resin, so that the first wiring 174 and the second wiring 176 may have an improved durability compared to the case in which wirings are disposed directly on the substrate 100. According to the present exemplary embodiment, when the touch panel is bent, the first insulating interlayer 130 and the second insulating interlayer 140 including the transparent resin may alleviate or relieve an external impact or a stress.

In exemplary embodiments, the first wiring 174 may include a first transparent conductive pattern 154 and a metal pattern 164 which may be stacked sequentially. For example, the first transparent conductive pattern 154 may include a material substantially same as to that of the first connection pattern 152, and the metal pattern 164 may include a metal such as copper or aluminum.

A transparent insulation layer or an encapsulation substrate (not illustrated) may be further disposed on the second insulating interlayer 140, the first connection pattern 152, and the metal pattern 164.

According to exemplary embodiments, the touch panel may include the plurality of first sensing electrodes 118, and each of the first sensing electrodes 118 may include the plurality of first sensing cells 112 and the plurality of first connection pattern 152. The first connection pattern 152 may be electrically connected to the adjacent first sensing cells 112 through the contact holes penetrating the second insulating interlayer 140 and the first insulating interlayer 130. That is, the first sensing cells 112 may be protected by the second insulating interlayer 140 during an etching process for forming the first connection pattern 152. Further, the second wiring 174 may be disposed on the second insulating interlayer 140, so that the second insulating interlayer 140 including the transparent resin may alleviate or relieve an external impact or a stress.

Figure 3:
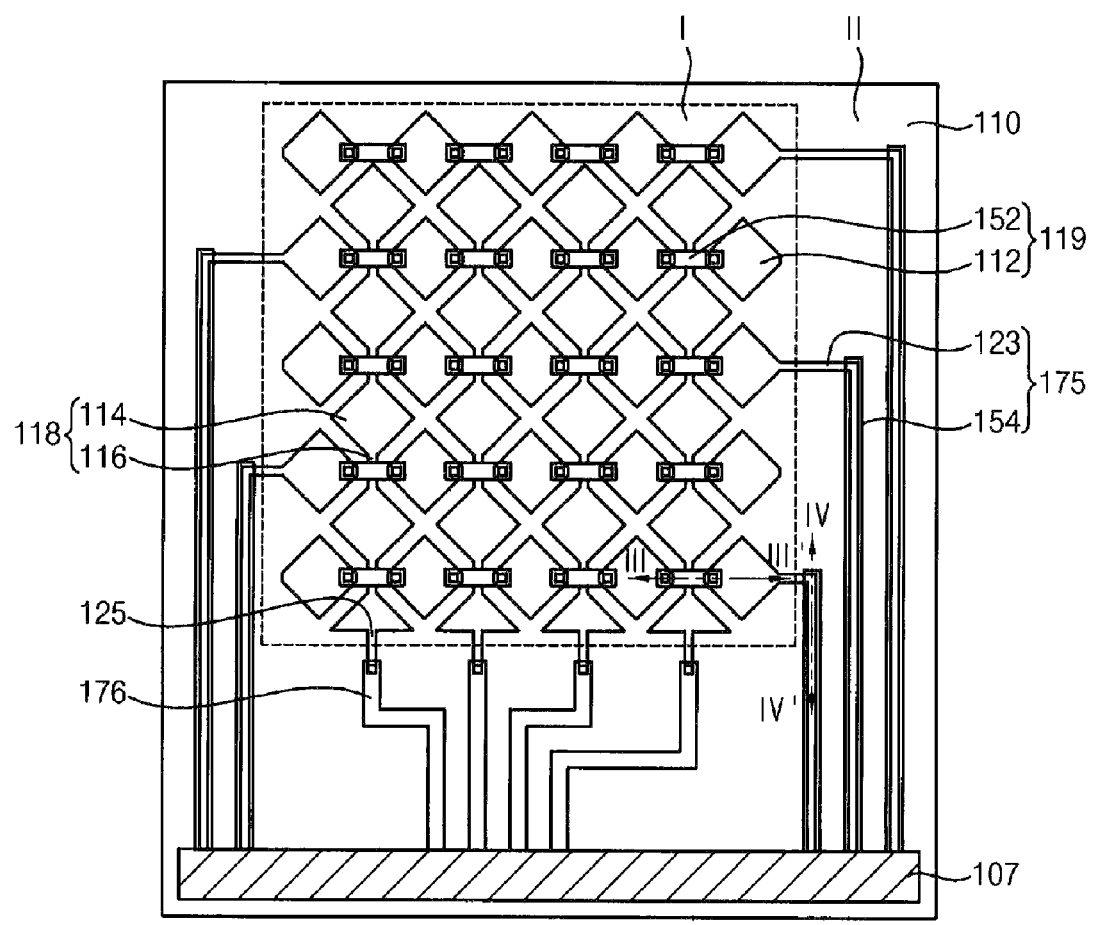
FIG. 3 is a plan view illustrating a touch panel in accordance with exemplary embodiments.
Figure 3:
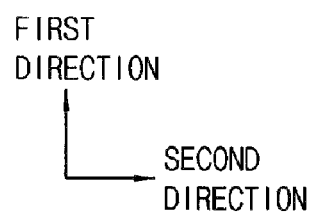
Figure 4:
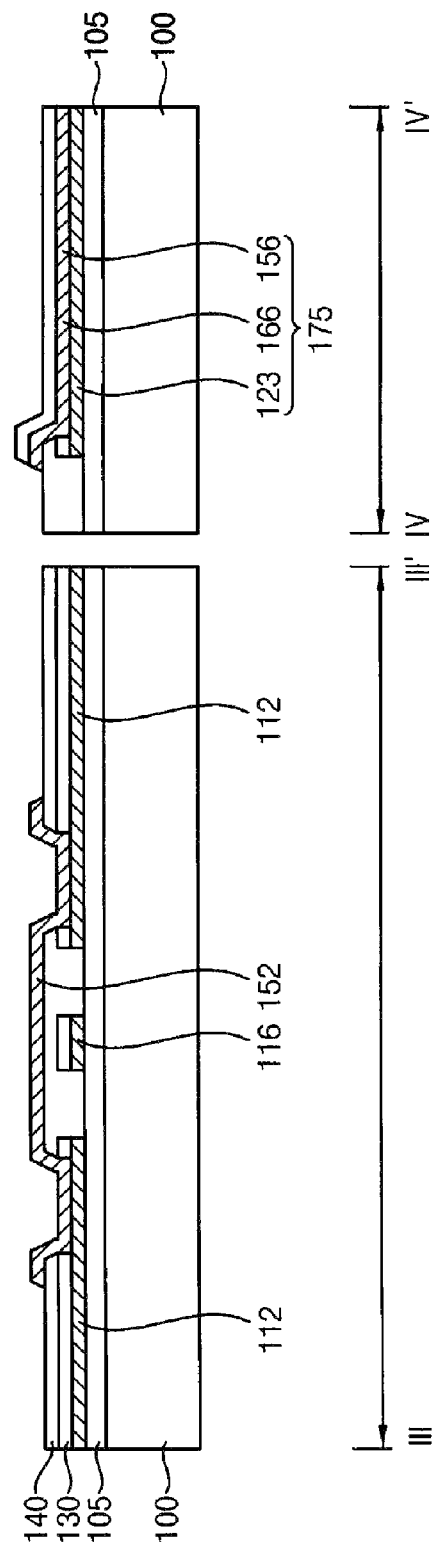
FIG. 4 is the cross sectional view illustrating a touch panel of FIG. 3 in accordance with exemplary embodiments.

FIG. 3 is a plan view illustrating a touch panel in accordance with exemplary embodiments, and FIG. 4 is a cross sectional view illustrating the touch panel of FIG. 3 in accordance with exemplary embodiments. FIG. 4 includes cross sectional views cut along line III-III' and line IV-IV' in FIG. 3.

Referring to FIGS. 3 and 4, the touch panel may include a substrate 100, a first sensing electrode 118, a second sensing electrode 119, a first wiring 175, a second wiring 176, and a pad portion 107. The touch panel in FIGS. 3 and 4 may be substantially same as or similar to the touch panel in FIGS. 1 and 2 except for the first wiring 175.

The substrate 100 may include a transparent insulation substrate. For example, the substrate 100 may include a glass substrate, a quartz substrate, a transparent resin substrate, etc. The substrate 100 may be divided into a first region I in which the sensing electrodes 118 and 119 may be disposed and a second region II in which the wirings 175 and 176 may be disposed.

In exemplary embodiments, a plurality of first sensing electrodes 118 and a plurality of second sensing electrodes 119 may be disposed in the first region I of the substrate 100. Each of the first sensing electrodes 118 may include a plurality of first sensing cells 112 and a plurality of connection pattern 152, and each of the second sensing electrodes 119 may include a plurality of sensing cells 114 and a plurality of connection patterns 116.

The first insulating interlayer 130 and the second insulating interlayer 140 may hold and protect the first sensing cells 112, the second sensing cells 114, and the second connection patterns 116.

The first wiring 175 and the second wiring 176 may be disposed on the buffer layer 105. For example, the first wiring 175 may include a first wiring pattern 123, a first transparent conductive pattern 158, and a second metal pattern 164, and the second wiring 176 may also include elements which may correspond to those of the first wiring 175. The first wiring pattern 123 may be directly connected to first sensing cells 112 and the pad portion 107. Therefore, the first wiring 175 and the second wiring 176 may have a multi layered structure, and may have an improved electrical conductivity.

Figure 5:
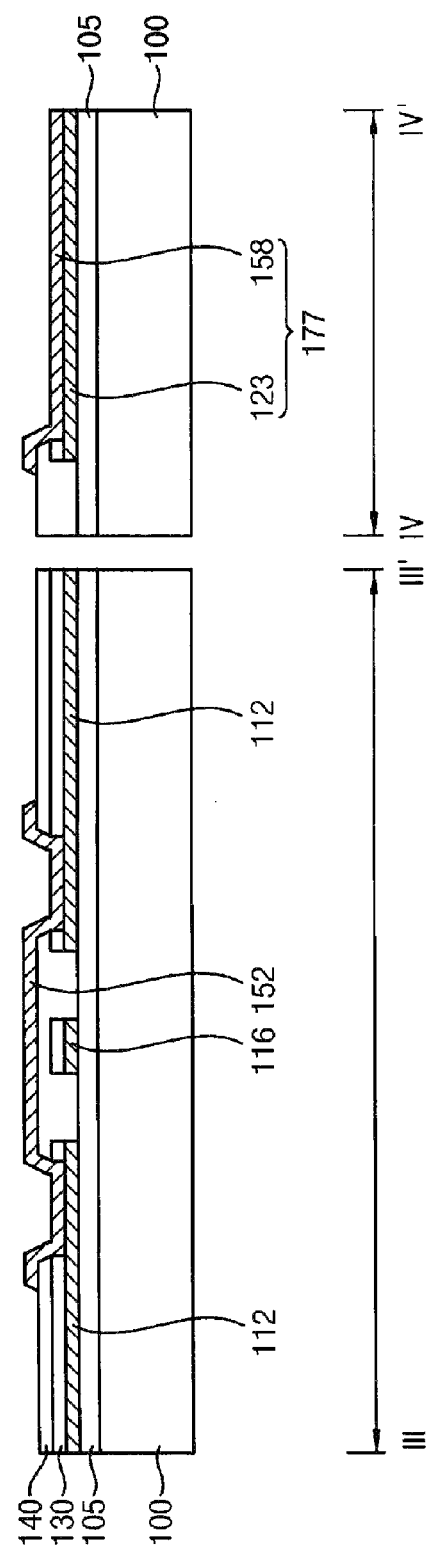
FIG. 5 is a cross sectional view illustrating a touch panel in accordance with exemplary embodiments.

FIG. 5 is a cross sectional view illustrating a touch panel in accordance with exemplary embodiments. The touch panel in FIG. 5 may be substantially same as or similar to the touch panel in FIGS. 3 and 4 except for the first wiring 177.

In exemplary embodiments, the first wiring 177 may include a first wiring pattern 123 and a first transparent conductive pattern 158. The first wiring pattern 123 may be directly connected to the first sensing cells 112 and a pad portion. Therefore, the first wiring 177 may have a double layered structure, and may have an improved electrical conductivity. The first wiring pattern 123 may be formed simultaneously during the process for forming the first sensing cells 112, and the first transparent conductive pattern 158 may be formed simultaneously during the process for forming the first connection pattern 152. Therefore, the process for forming the first wiring 177 may be simplified.

FIGS. 6 to 16 are plan views and cross sectional views illustrating a method of manufacturing a touch panel in accordance with exemplary embodiments. FIGS. 6, 8, 10, 11, 12, 14, 15, and 16 illustrate cross sectional views cut along line III-III' and line IV-IV' in the plan views.

Figure 6:
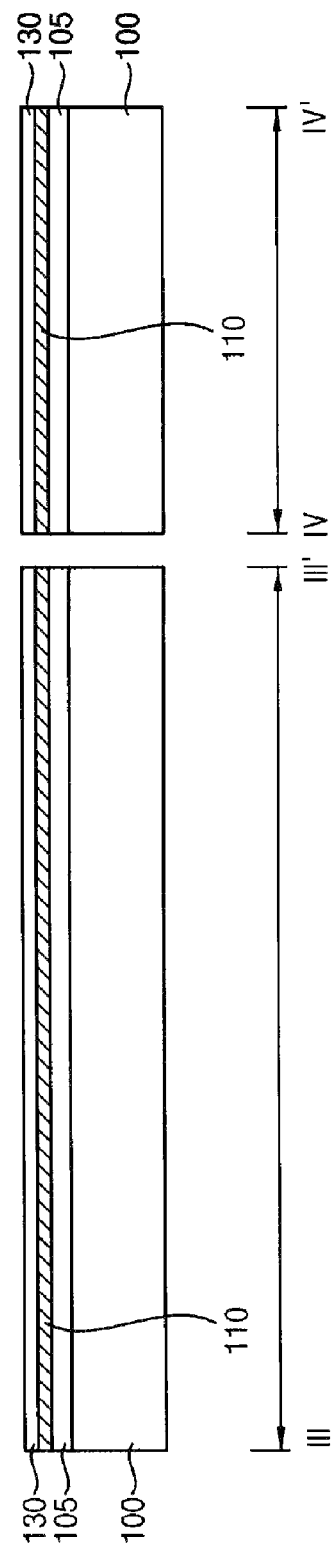
FIGS. 6, 7, 8, 9, 10, 11, 12, 13, 14, 15, and 16 are plan views and cross sectional views illustrating a method of manufacturing a touch panel in accordance with exemplary embodiments.

Referring to FIG. 6, a buffer layer 105, a metal nanowire layer 110, and insulation layer 130 may be formed on a substrate 100.

The substrate 100 may include a transparent insulation substrate. For example, the substrate 100 may include a glass substrate, a quartz substrate, a transparent resin substrate, etc. The substrate 100 may be divided into a first region I and a second region II. In exemplary embodiments, the first region I may be a sensing region in which sensing electrodes 118 and 119 (See FIG. 7) may be located, and the second region II may be a peripheral region in which wirings 174 and 176 (See FIG. 13), and a pad portion 107 may be located.

The buffer layer 105 may be formed on the substrate 100. For example, the buffer layer 105 may include a transparent resin such as polycarbonate-based resin. Alternatively, when the substrate 100 includes the transparent resin substrate, the process for forming the buffer layer 105 may be omitted.

The metal nanowire layer 110 may be formed on the buffer layer 105. The metal nanowire layer 110 may be formed by; dispersing a plurality of metal nanowires in a solution, coating the solution on the buffer layer 105, and dehydrating the solution. Therefore, the plurality of metal nanowires may be arranged to form an irregular network.

In exemplary embodiments, the solution may include at least one of water, alcohols, ketones, and ethers that may effectively disperse the plurality of metal nanowires, and may not corrode or oxidize the plurality of metal nanowires. The solution (that is, solvent) may have a relatively high volatility at a temperature above about 100° C.

In exemplary embodiments, the metal nanowires may have a width of about 10 nm to about 50 nm, and may have a length of about 1 μm to about 10 μm. Further, the metal nanowires may include, for example, Ag nanowires. The metal nanowires may have a relatively large length, and may be arranged to form the network, so that the metal nanowire layer 110 may have a relatively small electrical resistance and a relatively high light transmittance. Further, the metal nanowires may have a relatively large ductility, So that even when the touch panel is bent, the metal nanowire layer 110 may not be broken.

Then, a first insulating interlayer 130 may be formed to cover the metal nanowire layer 110. In exemplary embodiments, the first insulating interlayer 130 may be formed using a transparent resin such as acryl-based resin. The transparent resin may be disposed not only on a top surface of metal nanowire layer 110, but also at an empty space between the metal nanowires. For example, the first insulating interlayer 130 may have a thickness of about 80 nm to about 120 nm.

Figure 7:
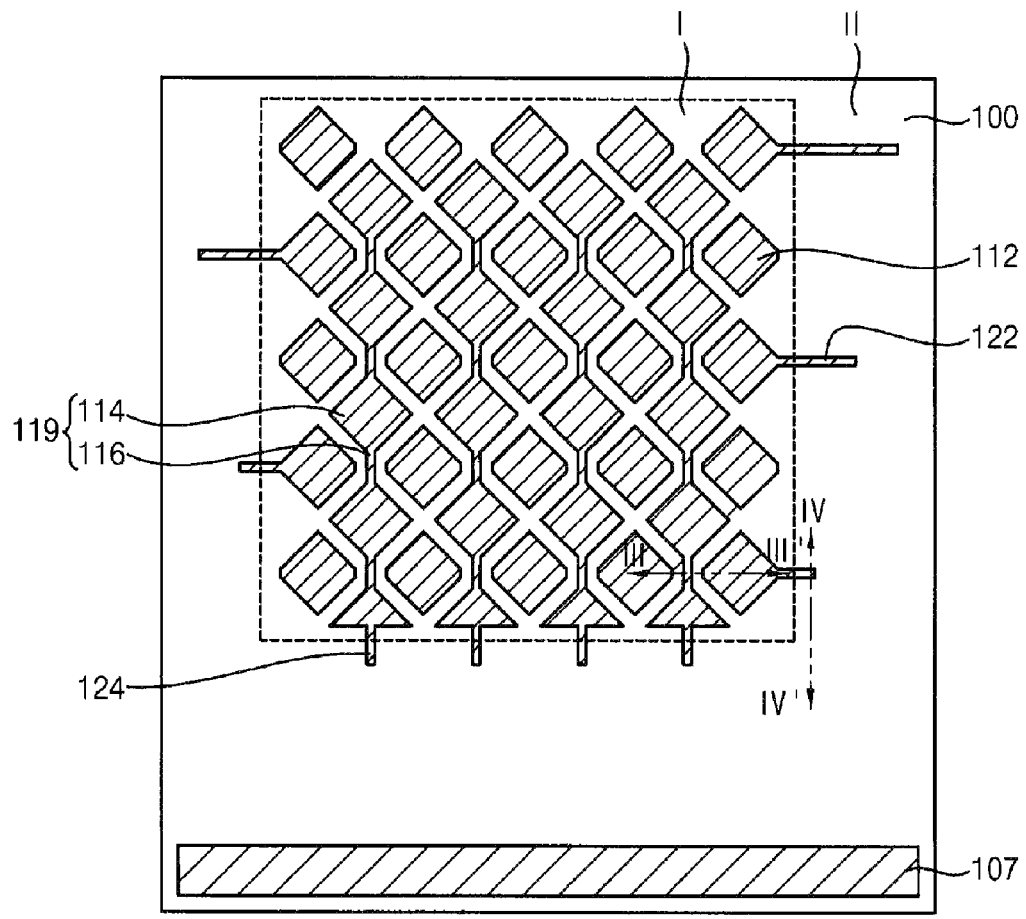
Figure 7:
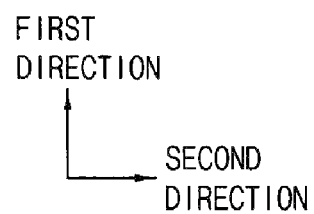
Figure 8:
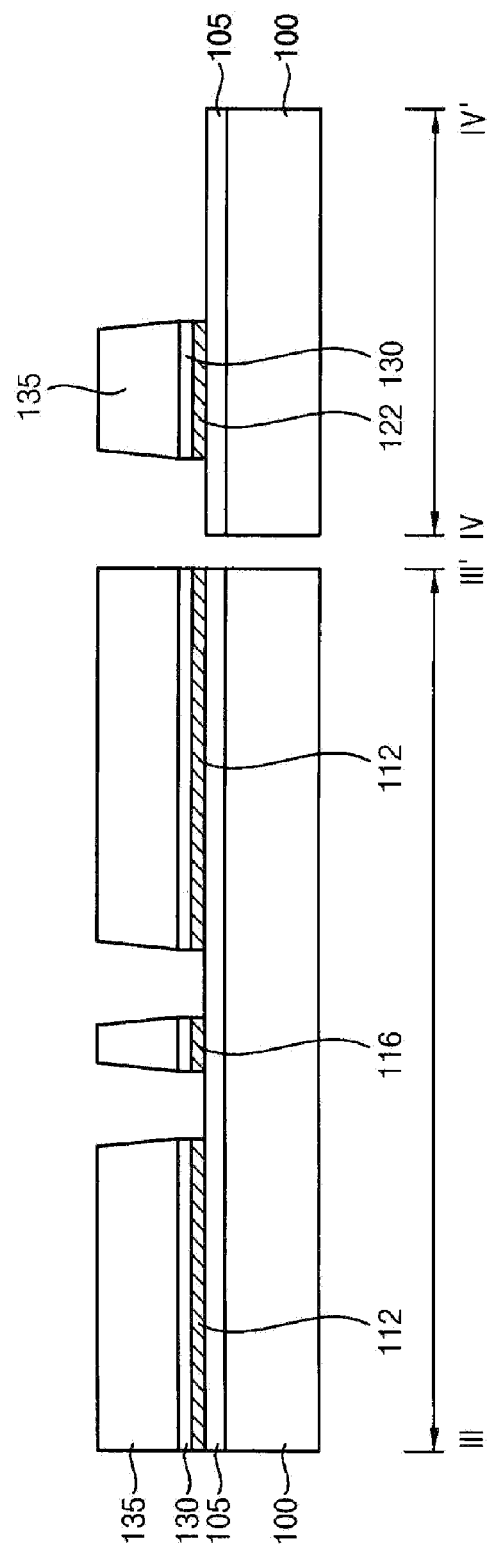

Referring to FIGS. 7 and 8, a first photoresist pattern 135 may be formed on the first insulating interlayer 130, and the metal nanowire layer 110 and the first insulating interlayer 130 may be partially removed.

The metal nanowire layer 110 may be patterned to form a plurality of first sensing cells 112, a plurality of second sensing cells 114, and a plurality of second connection patterns 116 in the first region I, and to form a first wiring connection pattern 122 and a second wiring connection pattern 124 in the second region II.

In this exemplary embodiment, the plurality of first sensing cells 112 may be arranged in the first direction and a second direction substantially perpendicular to the first direction.

Further, the plurality of second sensing cells 114 may be arranged in the first direction and the second direction. Each of the second connection patterns 116 may connect the adjacent second sensing cells 114 in the first direction. Therefore, the plurality of second sensing cells 114 and the plurality of second connection patterns 116 may constitute a second sensing electrode 119. In exemplary embodiments, a plurality of second sensing electrodes 119 may be arranged in the second direction, and each of the second sensing electrodes 119 may extend in the first direction.

In exemplary embodiments, one of the first sensing cells 112 disposed at a side end portion of the first region I may be electrically connected to the first wiring connection pattern 122 disposed in the second region II, one of the second sensing cells 114 disposed at a bottom end portion of the first region I may be electrically connected to the second wiring connection pattern 124. However, the first wiring connection pattern 122 and the second wiring connection pattern 124 may not directly contact the pad portion 107.

In exemplary embodiments, the pad portion 107 may be formed simultaneously during the process for forming the first and second sensing cells 112 and 114. Alternatively, the pad portion 107 may be formed before or after forming the first and second sensing cells 112 and 114.

The first photoresist pattern 135 may be removed through an ashing process or a strip process.

Figure 9:
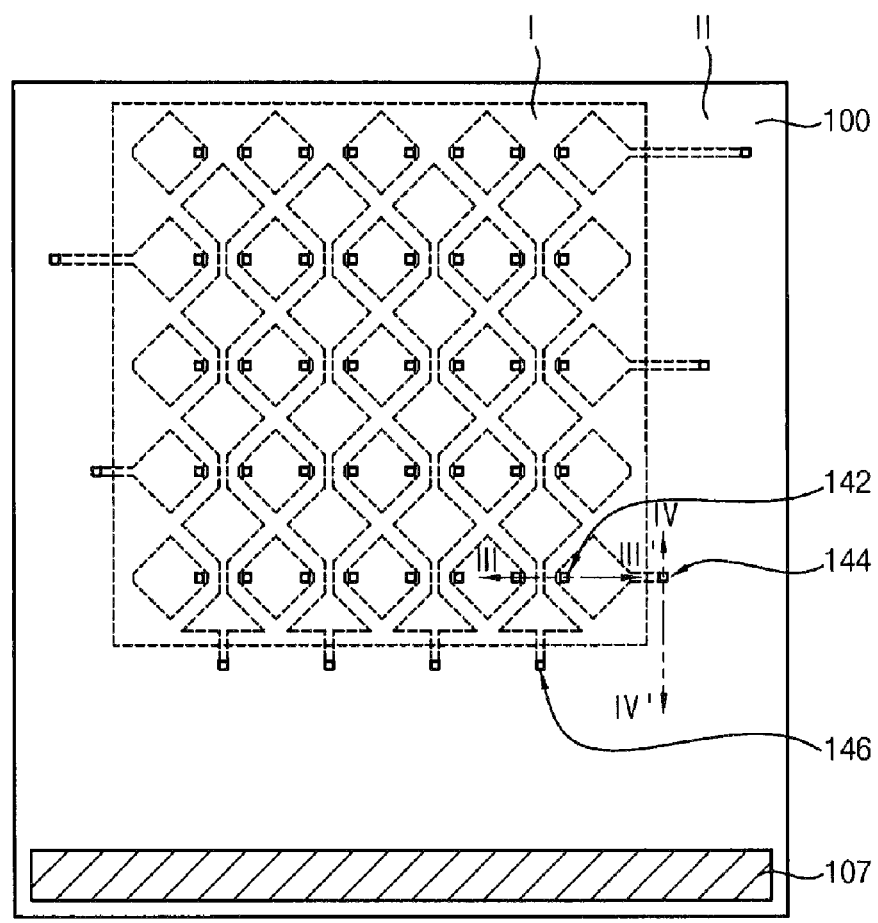
Figure 10:
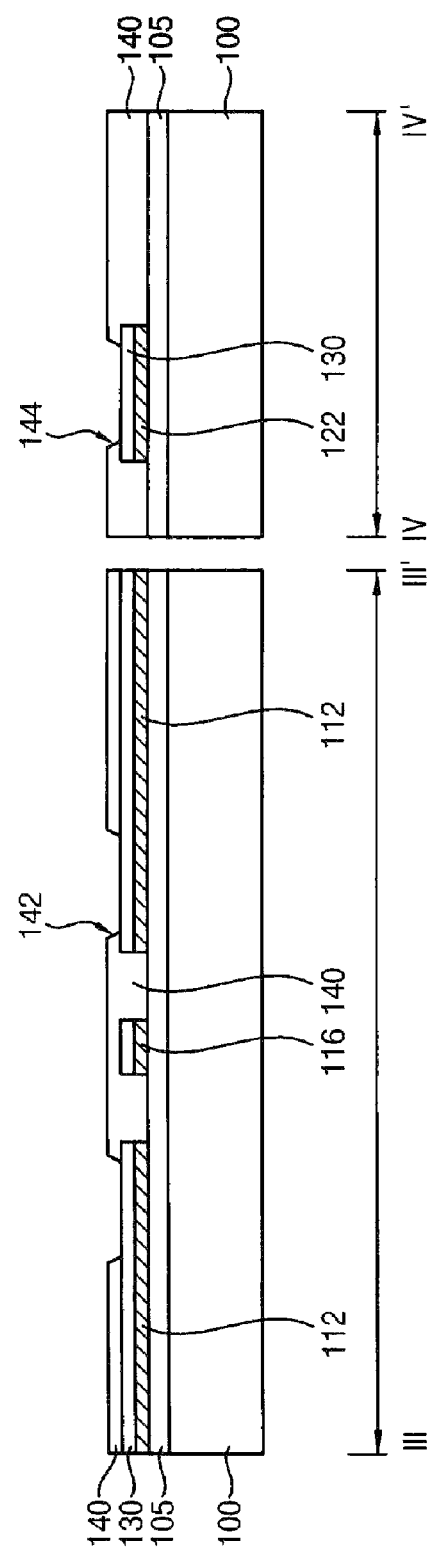

Referring to FIGS. 9 and 10, a second insulating interlayer 140 may be formed on the first insulating interlayer 130, and the second insulating interlayer 140 may be partially removed to form contact holes 142, 144, and 146.

The second insulating interlayer 140 may be formed using a transparent resin such as acryl-based resin. In exemplary embodiments, the second insulating interlayer 140 may be formed to cover the first insulating interlayer 130 in the first region I and the second region II. In exemplary embodiments, the second insulating interlayer 140 may have a thickness of about 1 μm to about 1.5 μm.

Then, the second insulating interlayer 140 may be partially etched to form the contact holes 142, 144, and 146 and expose some portions of the first insulating interlayer 130 overlapping the first sensing cells 112, the first wiring connection pattern 122, and the second wiring connection pattern 124. Specifically, the first contact holes 142 may expose portions of the first insulating interlayer 130 which may overlap the first sensing cells 112; the second contact holes 144 may expose portions of the first insulating interlayer 130 which may overlap the first wiring connection pattern 122; and the third contact holes 146 may expose portions of the first insulating interlayer 130 which may overlap the second wiring connection pattern 124. In other exemplary embodiments, the contact holes 142, 144, and 146 may partially expose the first sensing cells 112, the first wiring connection pattern 122, and the second wiring connection pattern 124.

Figure 11:
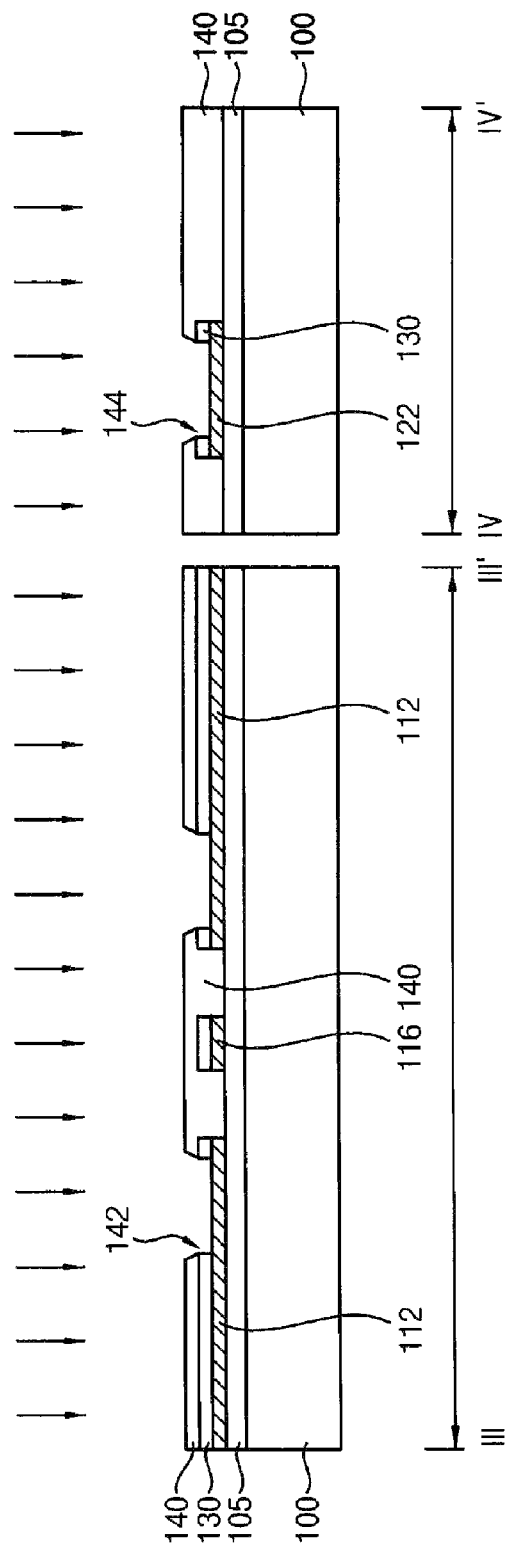

Referring to FIG. 11, a plasma treatment process may be performed to remove exposed portions of the first insulating interlayer 130, and increase a roughness of a surface of the second insulating interlayer 140.

The plasma treatment process may be performed in an atmosphere including an inert gas. For example, the plasma treatment process may be performed using argon gas.

The plasma treatment process may partially remove the first insulating interlayer 130 exposed by the contact holes 142, 144, and 146, and the second insulating interlayer 140. Therefore, the contact holes 142, 144, and 146 may directly expose the first sensing cells 112, the first wiring connection pattern 122, and the second wiring connection pattern 124. Also the roughness of the surface of second insulating interlayer 140 may be increased to improve the bonding strength with a transparent conductive layer. (See FIG. 12).

Figure 12:
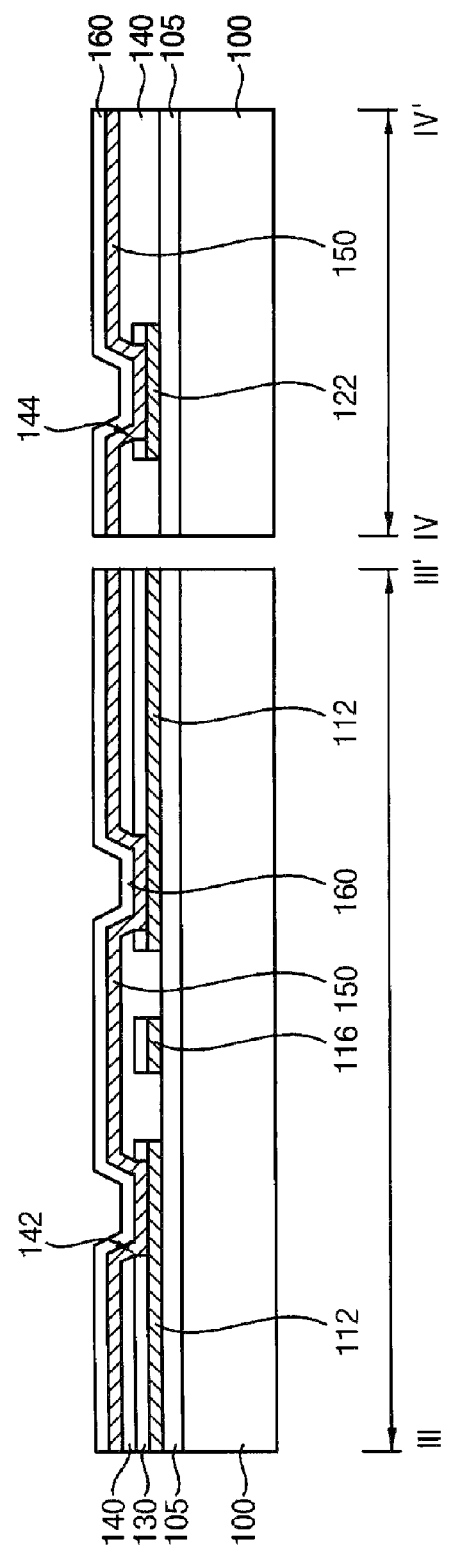

Referring to FIG. 12, a transparent conductive layer 150 and a metal layer 160 may be formed on a top surface of the second insulating interlayer 140 and inner walls of the contact holes 142, 144, and 146.

The transparent conductive layer 150 may be formed by an evaporation process or a sputtering process using a transparent conductive material such as indium zinc oxide (IZO) or indium tin oxide (ITO). Therefore, the transparent conductive layer 150 may be electrically connected to the first sensing cells 112, the first wiring connection pattern 122, and the second wiring connection pattern 124. Further, the second insulating interlayer 140 may have a rough surface, so that a bonding strength between the second insulating interlayer 140 and the transparent conductive layer 150 may be improved. That is, when the touch panel is bent, the transparent conductive layer 150 may not be lifted off. In exemplary embodiments, the transparent conductive layer 150 may have a thickness of about 500 Å to about 1000 Å. Therefore, the transparent conductive layer 150 may have a relatively small electrical resistance and a relatively high light transmittance.

The metal layer 160 may be formed by an evaporation process or a sputtering process using a metal such as copper or aluminum. In exemplary embodiments, the metal layer 160 may have a thickness about 2000 Å to about 4000 Å. Therefore, the metal layer 160 may have a relatively small electrical resistance.

Figure 13:
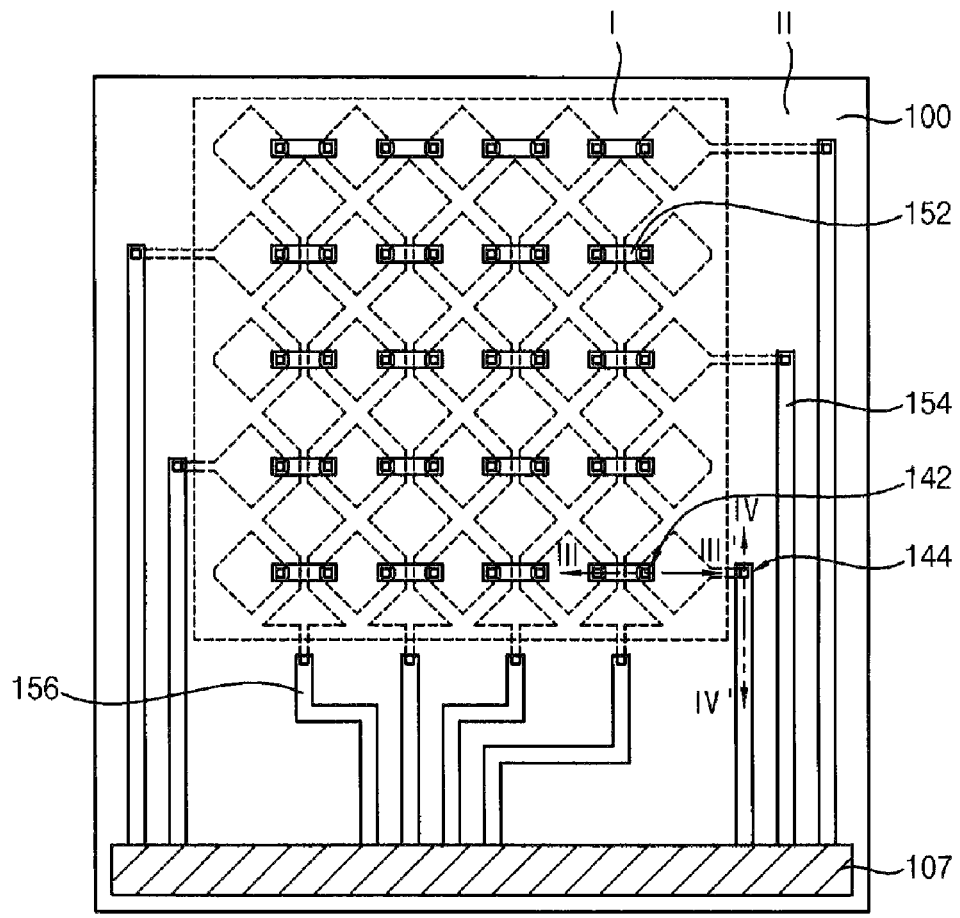
Figure 13:
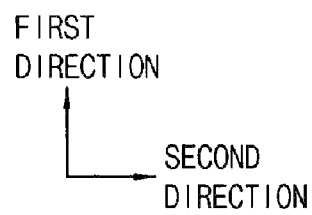
Figure 14:
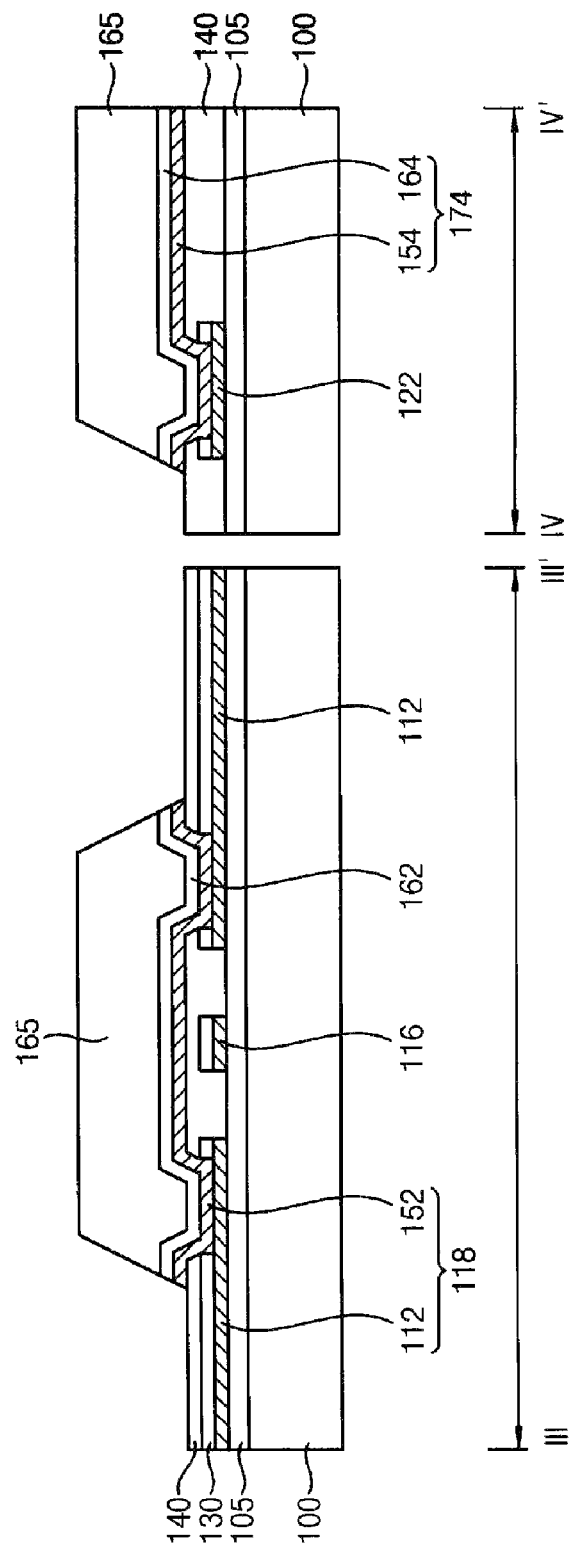

Referring to FIGS. 13 and 14, a second photoresist pattern 165 may be formed on the metal layer 160, and then the metal layer 160 and the transparent conductive layer 150 may be partially removed.

The metal layer 160 and the transparent conductive layer 150 may be partially etched using the second photoresist pattern 165 as an etching mask. In exemplary embodiments, the metal layer 160 may be etched using a first etching solution having a relative high etch rate about the metal layer 160, and then the transparent conductive layer 150 may be etched using a second etching solution having a relatively high etch rate about the transparent conductive layer 150. In other words, the etching process for the metal layer 160 and the etching process for the transparent conductive layer 150 may be performed separately.

The transparent conductive layer 150 may be patterned to form a first connection pattern 152, a first transparent conductive pattern 154 and a second transparent conductive pattern 156, simultaneously.

The first connection pattern 152 may be disposed in the first region I. The first connection pattern 152 may electrically connect the adjacent first sensing cells 112 through the first contact holes 142. Therefore, the first connection pattern 152 may serve as a bridge which may electrically connect the adjacent first sensing cells 112 in the second direction. Accordingly, the plurality of first connection patterns 152 and the plurality of first sensing cells 112 may constitute a first sensing electrode 118.

The first transparent conductive pattern 154 and the second transparent conductive pattern 156 may be disposed in the second region II. The first transparent conductive pattern 154 and the second transparent conductive pattern 156 may be electrically connected to the first wiring connection pattern 154 and the second wiring connection pattern 156, respectively. Therefore, the first transparent conductive pattern 154 and the second transparent conductive pattern 156 may electrically connect the first sensing cells 118 and the second sensing cells 119 with the pad portion 107, respectively.

The first connection pattern 152, the first transparent conductive pattern 154, and the second transparent conductive pattern 156 may be disposed at the inner walls of the first contact holes 142, the second contact holes 144, and the third contact holes 146. Therefore, the first sensing cells 112 may be protected by the first insulating interlayer 130 and the second insulating interlayer 140 during the etching process for forming the first connection pattern 152. In other words, the first sensing cells 112 may not be exposed to an etching solution of the etching process, and the first sensing cells 112 may not be damaged by the etching process, so that the touch panel may have an improved reliability.

Further, the metal layer 160 may be patterned to form a first metal pattern 162 in the first region I and a second metal pattern 164 in the second region II. The first transparent conductive pattern 154 and the second transparent conductive pattern 156 and the second metal pattern 164 in the second region II may constitute a wiring 174 having a relatively small electrical resistance.

Figure 15:
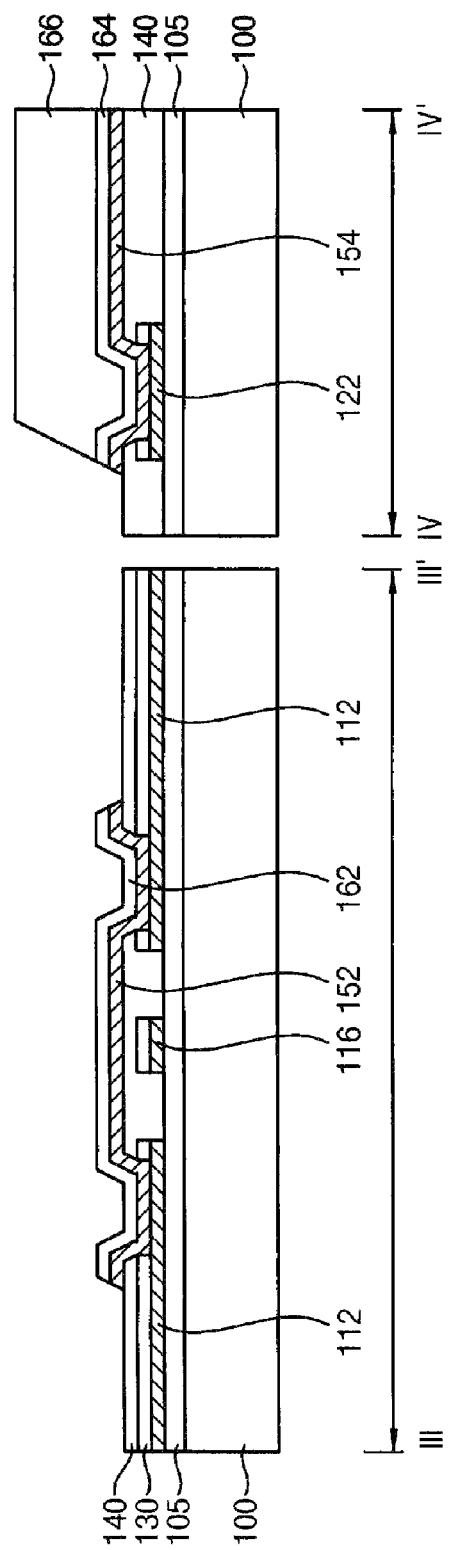

Referring to FIG. 15, the second photoresist pattern 165 may be removed, and then a third photoresist pattern 166 may be form on the second metal pattern 164.

The second photoresist pattern 165 may be removed by an ashing process or a strip process. Then, the third photoresist pattern 166 may be formed to cover the second metal pattern 164 disposed in the second region II. That is, the third photoresist pattern 166 may expose the first metal pattern 162.

Figure 16:
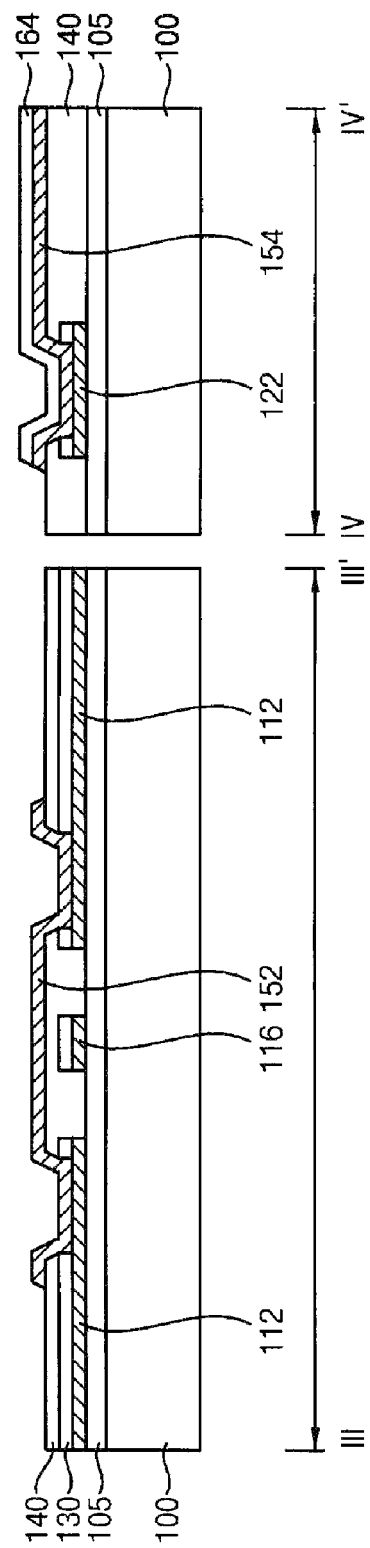

Referring to FIG. 16, the first metal pattern 162 is removed using the third photoresist pattern 166 as an etching mask.

As the first metal pattern 162 may be removed, the metal patterns having a relatively small light transmittance may be removed from the first region I. Therefore, the touch panel may have a relatively high light transmittance in the first region I.

According to exemplary embodiments, the first sensing cells 112, the second sensing cells 114, the second connection pattern 116, the first wiring connection pattern 122, and the second wiring connection pattern 124 may include the metal nanowires which may have a relatively large length and may be arranged to form the network, so that the first sensing cells 112, the second sensing cells 114, the second connection pattern 116, the first wiring connection pattern 122, and the second wiring connection pattern 124 may have a relatively small electrical resistance and a relatively high light transmittance. Further, the first sensing cells 112 may be protected by the first insulating interlayer 130 and the second insulating interlayer 140 during the etching process for forming the first connection pattern 152. That is, the first sensing cells 112 may not be damaged during the etching process, so that a connection between the first connection pattern 152 and the first sensing cells 112 may have an improved reliability. The first transparent conductive pattern 154 and the second transparent conductive pattern 156 may be formed simultaneously during the process for forming the first connection pattern 152. The first transparent conductive pattern 154 and the second metal pattern 164 in the second region II may constitute the first wiring having a relatively small electrical resistance.

FIGS. 17 to 20 are plan views and cross sectional views illustrating a method of manufacturing a touch panel in accordance with exemplary embodiments. The method of manufacturing the touch panel in FIGS. 17 to 20 may be substantially same as or similar to the method described with reference to FIGS. 6 to 16.

The processes of present exemplary embodiment are substantially same as or similar to those of FIGS. 6 to 11. In other words, a metal nanowire layer and a first insulating interlayer 130 may be formed on a substrate 100 having a first region I and a second region II, and the metal nanowire layer and the first insulating interlayer 130 may be patterned to form first sensing cells 112, second sensing cells 114, second connection pattern 116, first wiring connection pattern 122, and second wiring connection pattern 124. Then, a second insulating interlayer 140 may be formed to cover the first insulating interlayer 130, and then the second insulating interlayer 140 may be partially removed to form contact holes 142 and 144. A plasma treatment process may be performed to remove portions of the first insulating interlayer 130, and to increase a roughness of the surface of the second insulating interlayer 140.

Figure 17:
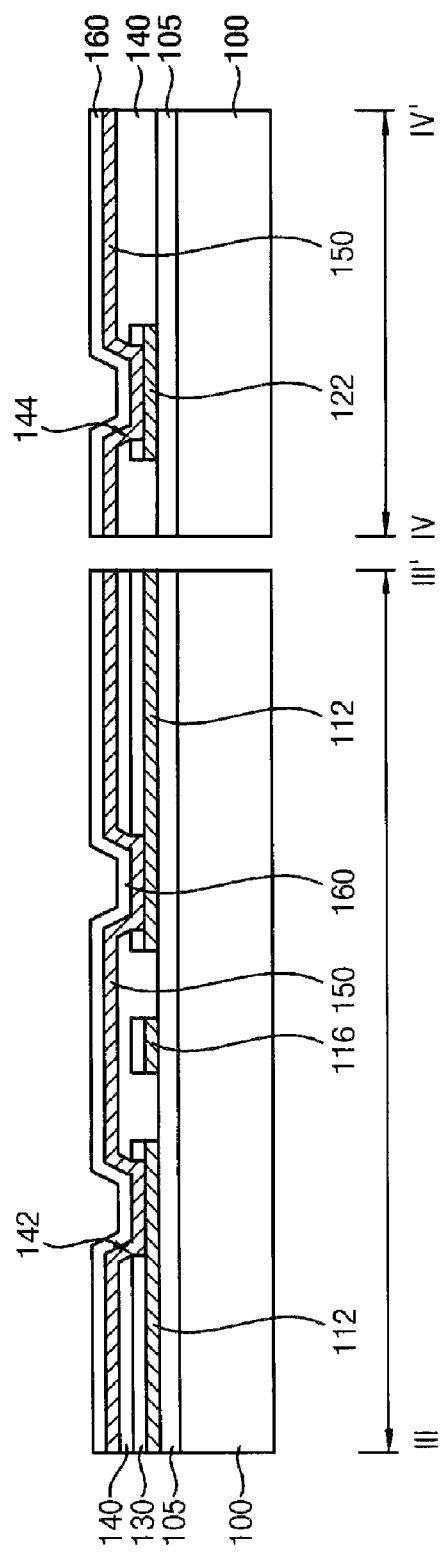
FIGS. 17, 18, 19, and 20 are plan views and cross sectional views illustrating a method of manufacturing a touch panel in accordance with exemplary embodiments.

Referring to FIG. 17, a transparent conductive layer 150 and a metal layer 160 may be formed on a top surface of the second insulating interlayer 140 and inner walls of the contact holes 142 and 144. Processes for forming the transparent conductive layer 150 and the metal layer 160 may be substantially the same as those of FIG. 12.

Figure 18:
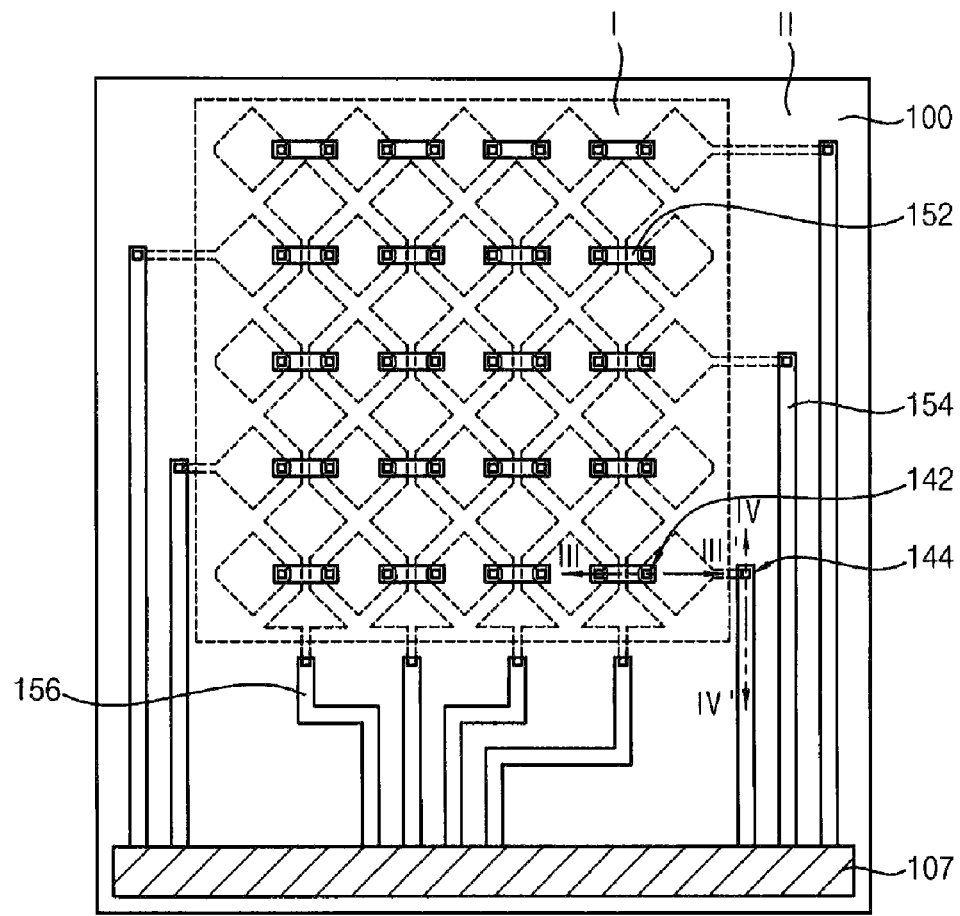
Figure 18:
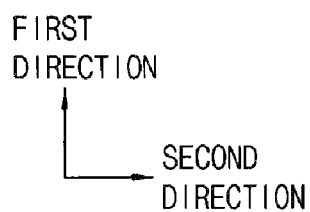
Figure 19:
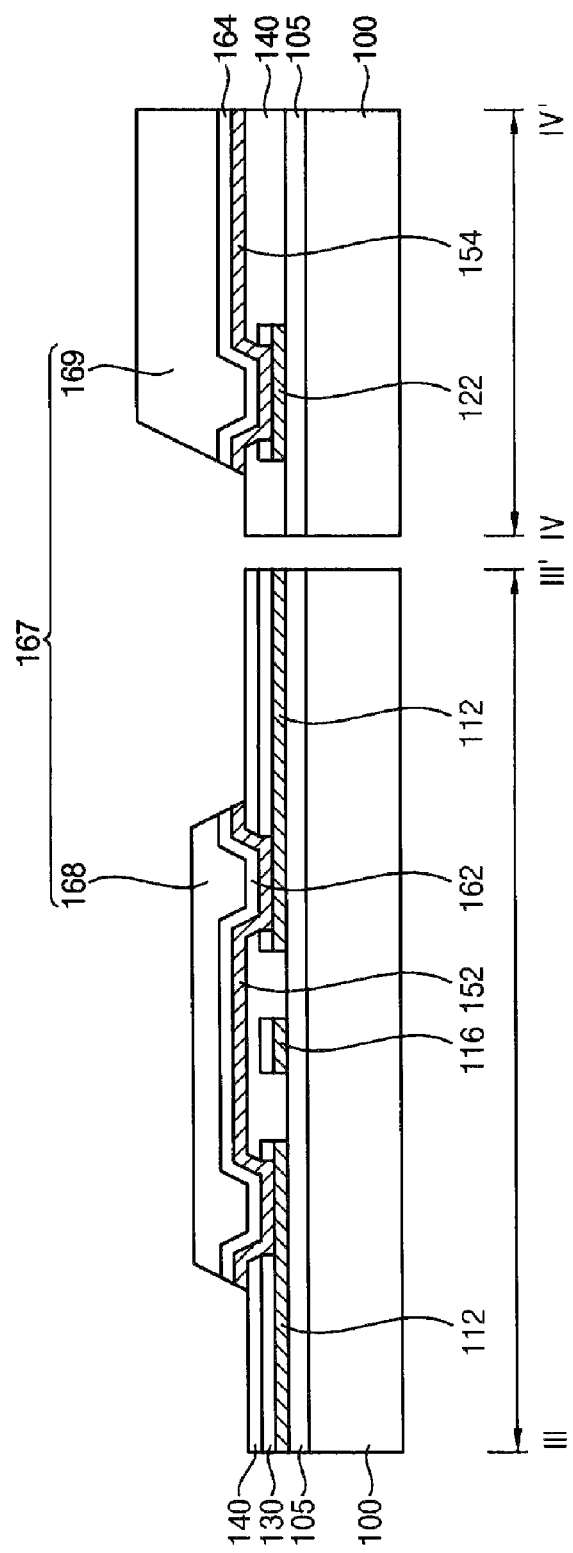

Referring to FIGS. 18 and 19, a second photoresist pattern 167 may be formed on the metal layer 160, and then the metal layer 160 and the transparent conductive layer 150 may be partially removed.

In exemplary embodiments, a photoresist layer may be formed on the metal layer 160, and the photoresist layer may be selectively exposed and developed using a halftone mask or a slit mask, thereby forming the second photoresist pattern 167. Therefore, the second photoresist pattern 167 may include at least two portions which may have different thicknesses. For example, the second photoresist pattern 167 may include a first thickness portion 168 in the first region I and a second thickness portion 169 in the second region II. In this exemplary embodiment, the second thickness portion 169 may be thicker than the first thickness portion 168.

Then, the transparent conductive layer 150 may be partially removed using the second photoresist pattern 167 as an etching mask, thereby forming a first connection pattern 152, a first transparent conductive pattern 154, and a second transparent conductive pattern 156, simultaneously. Further, the metal layer 160 may be partially removed using the second photoresist pattern 167 as an etching mask, thereby forming a first metal pattern 162 and a second metal pattern 164.

Figure 20:
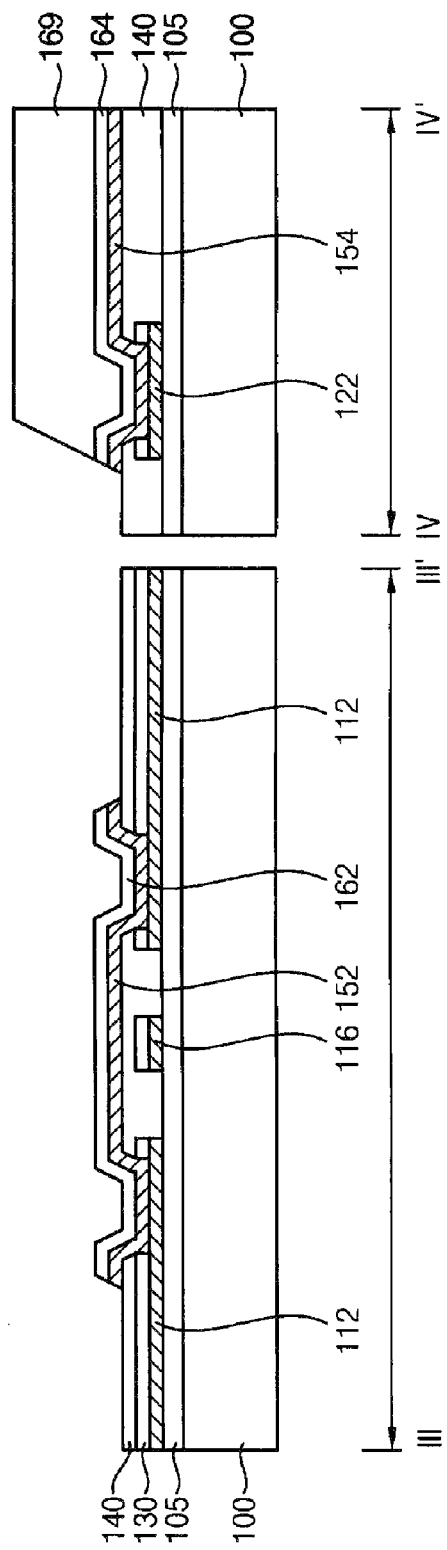

Referring FIG. 20, the first thickness portion 168 of the second photoresist pattern 167 may be removed, and then the first metal pattern 162 may be removed using the second thickness portion 169 of the second photoresist pattern 167.

The second photoresist pattern 167 may be partially removed. In this exemplary embodiment, the first thickness portion 168 having a relatively small thickness may be sufficiently removed, while the second thickness portion 169 may be partially removed. Therefore, the second thickness portion 169 may cover the second metal pattern 164.

Then, the first metal pattern 162 is removed using the second thickness portion 169 of the second photoresist pattern 167 as an etching mask. In this exemplary embodiment, the second metal pattern 164 may not be removed.

Then, an ashing process or a strip process may be performed to remove the second thickness portion 169 of the second photoresist pattern 167.

According to exemplary embodiments, the second photoresist pattern 167 may be formed using the halftone mask or the slit mask. Therefore, the metal layer 160 and the transparent conductive layer 150 may be patterned to have different shapes using the second photoresist pattern 167.

FIGS. 21 to 25 are plan views and cross sectional views illustrating a method of manufacturing a touch panel in accordance with exemplary embodiments. The method of manufacturing the touch panel in FIGS. 21 to 25 may be substantially same as or similar to the method described with reference to FIGS. 6 to 16.

The processes of present exemplary embodiment are substantially same as or similar to those of FIG. 6. In other words, a buffer layer 105, a metal nanowire layer, and a first insulating interlayer 130 may be formed on a substrate 100 having a first region I and a second region II.

Figure 21:
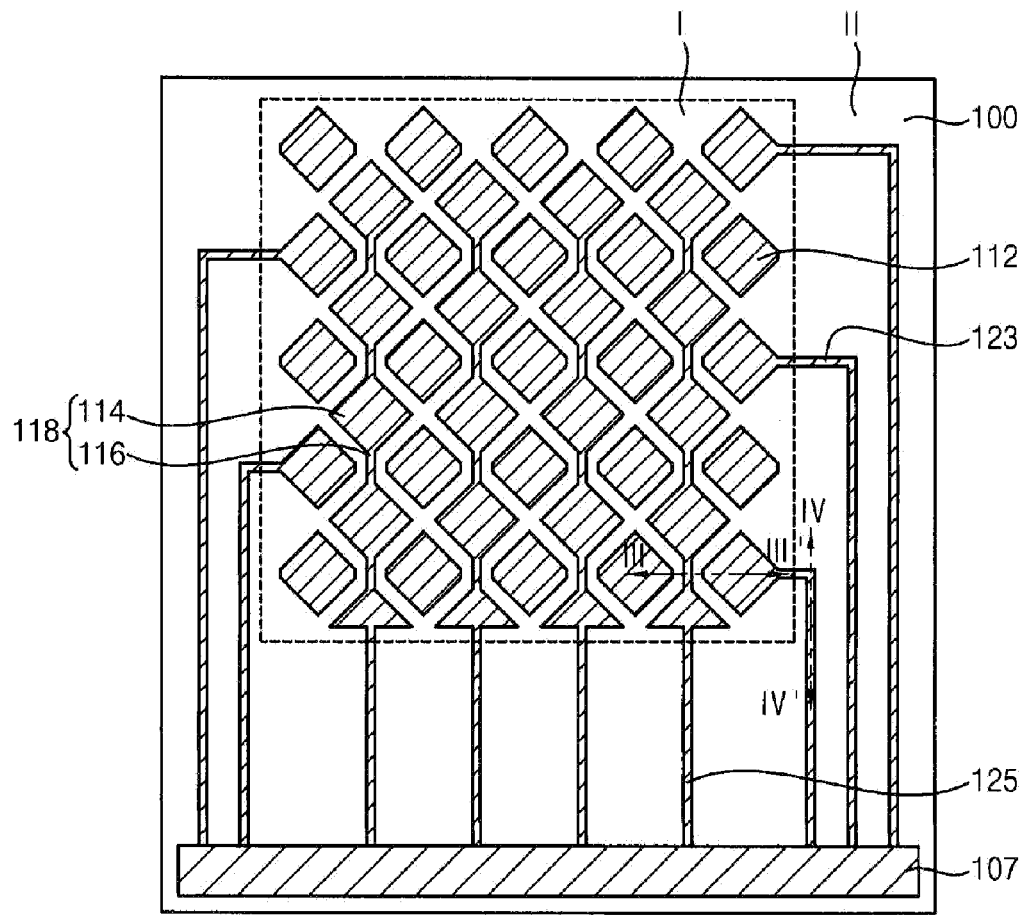
FIGS. 21, 22, 23, 24, and 25 are plan views and cross sectional views illustrating a method of manufacturing a touch panel in accordance with exemplary embodiments.
Figure 21:
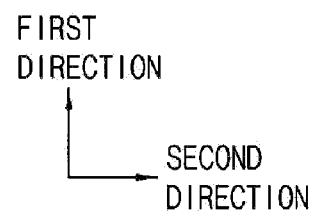
Figure 22:
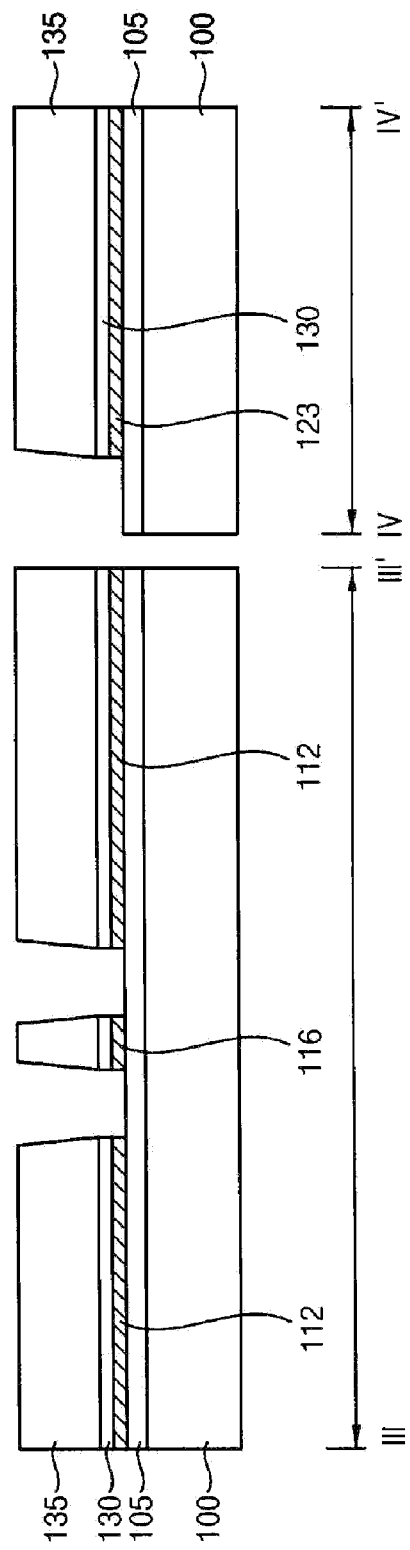

Referring to FIGS. 21 and 22, a first photoresist pattern 135 is formed on the first insulating interlayer 135, and the metal nanowire layer and the first insulating interlayer 130 may be partially removed using the first photoresist pattern 135.

In exemplary embodiments, the metal nanowire layer and the first insulating interlayer 130 may be patterned to form a plurality of first sensing cells 112, a plurality of second sensing cells 114, and a plurality of second connection patterns 116 in the first region I, and to form a first wiring pattern 123 and a second wiring pattern 125 in the second region II.

In exemplary embodiments, the first wiring pattern 123 may electrically connect the first sensing cell 112 disposed at a side end portion of the first region I with a pad portion 107 in the second region II. Further, the second wiring pattern 125 may electrically connect the second sensing cell 114 disposed at a bottom end portion of the first region I with the pad portion 107 in the second region II.

Figure 23:
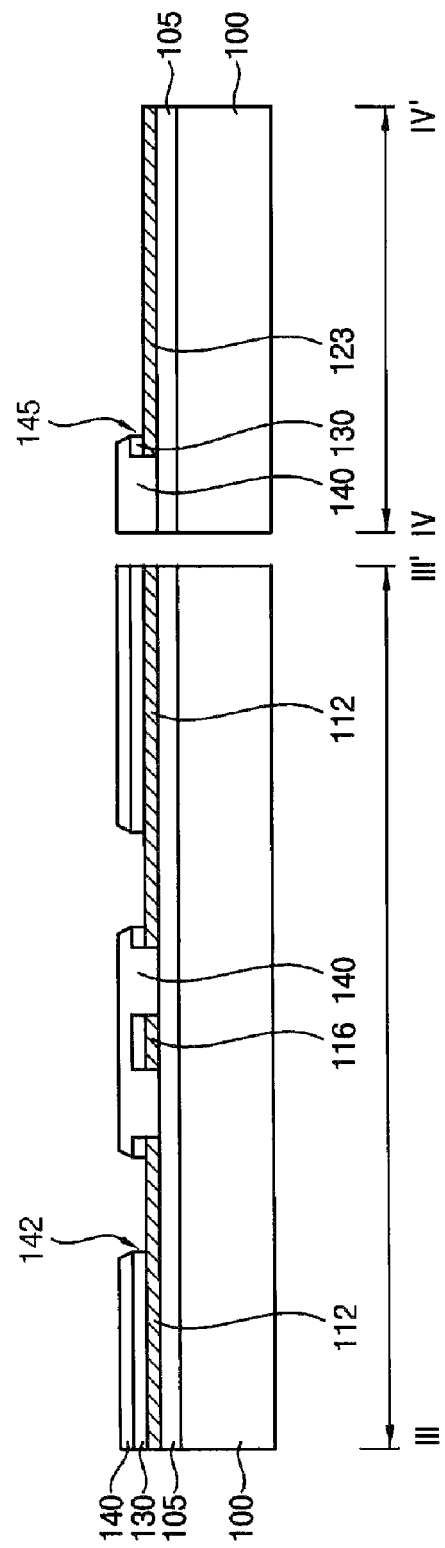

On the other hand, the plurality of first sensing cells 112, the plurality of second sensing cells 114, and the plurality of second connection pattern 116 may be substantially same as or similar to those illustrate in FIGS. 7 and 8, Referring to FIG. 23, a second insulating interlayer 140 may be formed on the first insulating interlayer 130, and the second insulating interlayer 140 may be partially removed to form contact holes 142 and openings 145. Then, a plasma treatment process may be performed to remove an exposed portion of the first insulating interlayer 130, and to increase a roughness of a surface of the second insulating interlayer 140.

The second insulating interlayer 140 may be formed using a transparent resin such as acryl-based resin. In exemplary embodiments, the second insulating interlayer 140 may be formed to cover the first insulating interlayer 130 in the first region I and the second region II.

Further, the second insulating interlayer 140 may be partially etched to form the contact holes 142 exposing some portions of the first insulating interlayer 130 which may overlap the plurality of first sensing cells 112, and to form the openings 145 exposing other portions of the first insulating interlayer 130 which may overlap the first wiring pattern 123 and the second wiring pattern 125.

Then, a plasma treatment process may be performed to remove the first insulating interlayer 130. Therefore, the contact holes 130 may expose the plurality of first sensing cells 112, and the openings 145 may expose the first wiring pattern 123 and the second wiring pattern 125.

Figure 24:
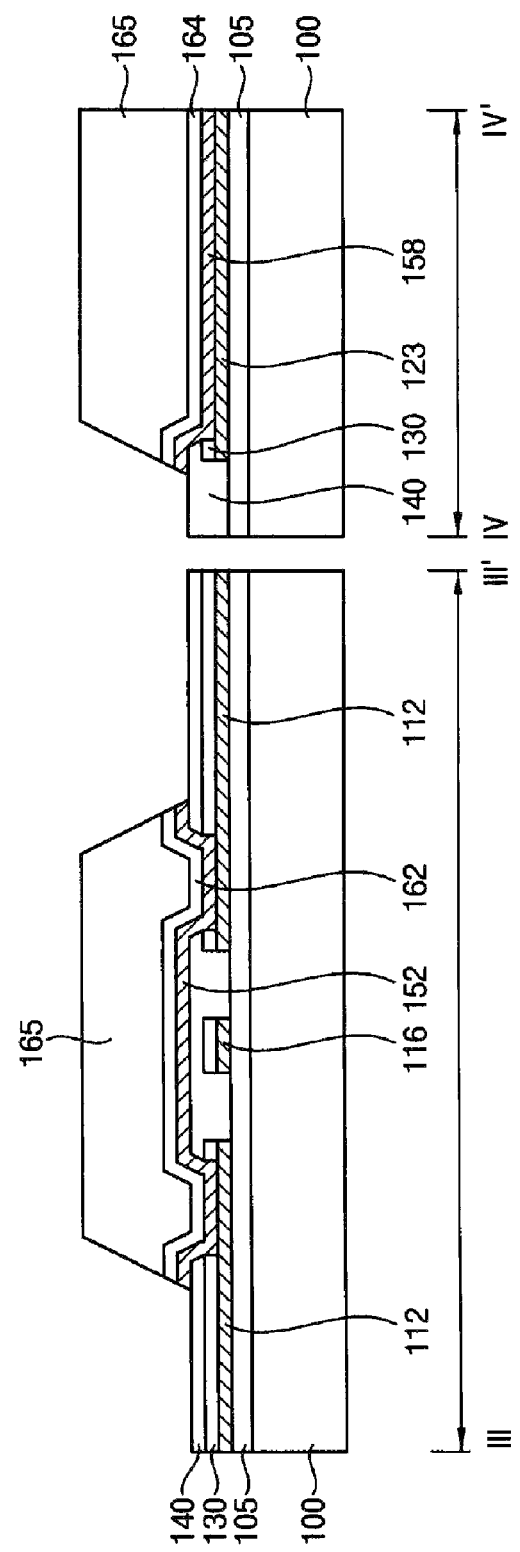

Referring to FIG. 24, a transparent conductive layer 150 and a metal layer 160 may be formed on a top surface of the second insulating interlayer 140 and inner walls of the contact holes 142 and the openings 145, and a second photoresist pattern 165 may be formed on the metal layer 160. Then, the transparent conductive layer 150 and the metal layer 160 may be patterned using the second photoresist pattern 165 as an etching mask, thereby forming a first connection pattern 152, a first transparent conductive pattern 158, a first metal pattern 162, and a second metal pattern 164.

In exemplary embodiments, the first wiring pattern 123, the first transparent conductive pattern 158 and the second metal pattern 164 may be stacked sequentially. In other words, the first wiring pattern 123, the first transparent conductive pattern 158, and the second metal pattern 164 may have a multi layered structure. Therefore, the wiring may have a relatively low electrical resistance and may have an improved reliability.

Then, the second photoresist pattern 165 may be removed through an ashing process or a strip process.

Figure 25:
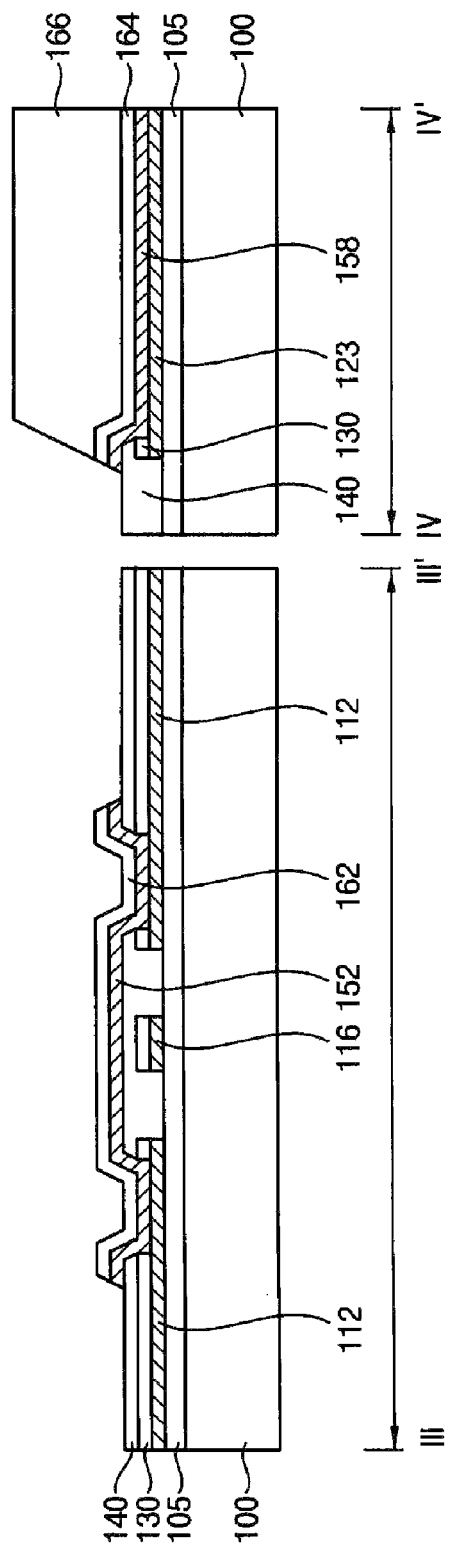

Referring to FIG. 25, a third photoresist pattern 166 may be formed on the second metal pattern 164, and the first metal pattern 162 may be removed using the third photoresist pattern 166. The process for removing the first metal pattern 162 may be substantially same as or similar to those illustrated in FIGS. 15 and 16.

Figure 26:
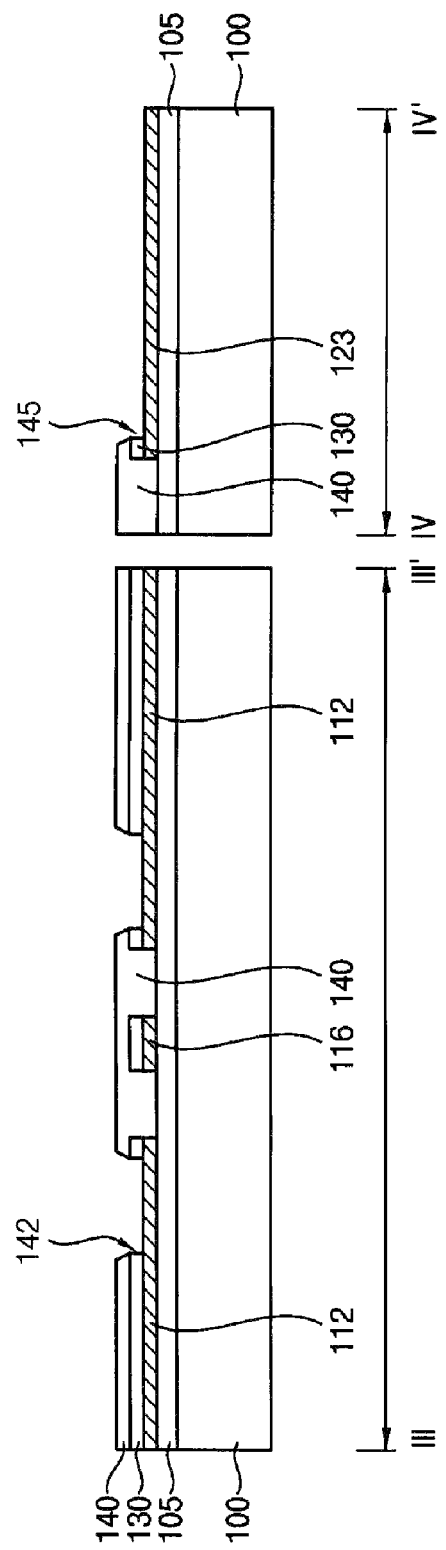
FIGS. 26 and 27 are cross sectional views illustrating a method of manufacturing a touch panel in accordance with exemplary embodiments.
Figure 27:
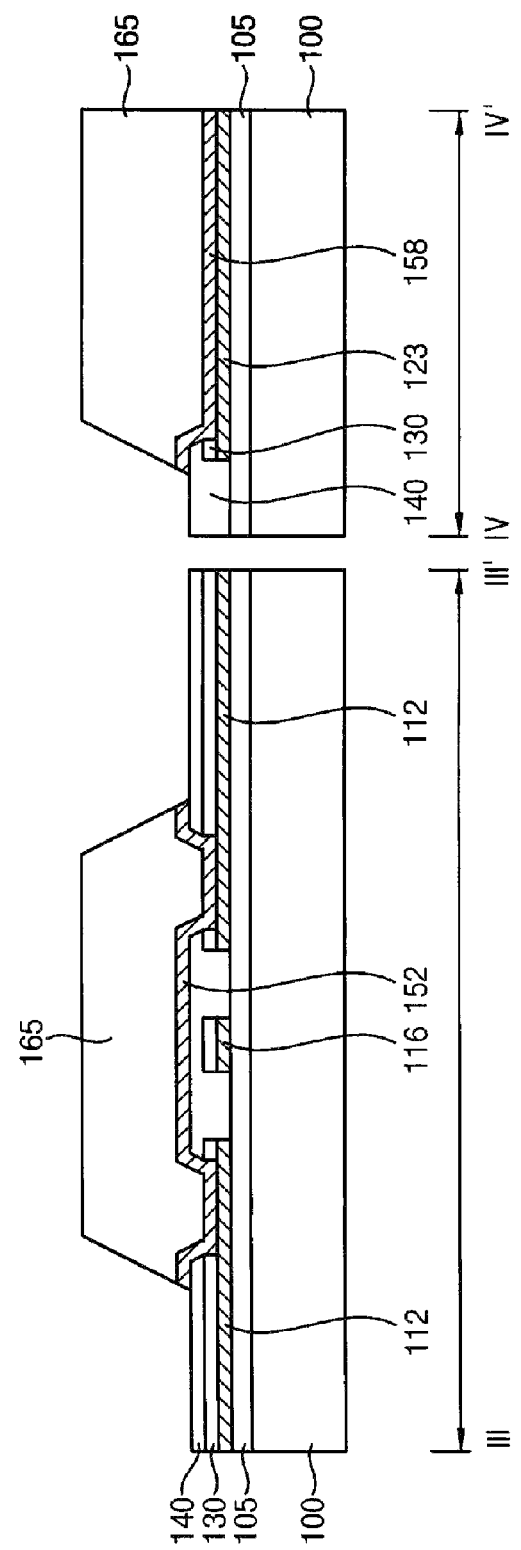

FIGS. 26 and 27 are cross sectional views illustrating a method of manufacturing a touch panel in accordance with exemplary embodiments. The method of manufacturing the touch panel in FIGS. 26 to 27 may be substantially same as or similar to the method described with reference to FIGS. 6 to 16.

The processes of present exemplary embodiments are substantially same as or similar to those of FIGS. 6 to 10. In other words, a buffer layer 105, a metal nanowire layer, and a first insulating interlayer 130 may be formed on a substrate 100 having a first region I and a second region II, and the metal nanowire layer and the first insulating interlayer 130 may be patterned to form first sensing cells 112, second connection pattern 116, and first wiring connection pattern 122.

Referring to FIG. 26, a second insulating interlayer 140 may be formed to cover the first insulating interlayer 130, and then the second insulating interlayer 140 may be partially removed to form contact holes 142 and openings 145. A plasma treatment process may be performed to remove portions of the first insulating interlayer 130, and to increase a roughness of a surface of the second insulating interlayer 140.

Referring to FIG. 27, a transparent conductive layer 150 may be formed on a top surface of the second insulating interlayer 140 and an inner wall of the contact holes 142 and the openings 145, and a second photoresist pattern 165 may be formed on the transparent conductive layer 150. Then, the transparent conductive layer 150 may be patterned using the second photoresist pattern 165 as an etching mask forming a first connection pattern 152 and a first transparent conductive pattern 158.

The first connection pattern 152 may be formed in the first region I, and the first transparent conductive pattern 158 may be formed in the second region II. The first transparent conductive pattern 158 and the first wiring pattern 123 may be stacked sequentially, and may constitute a wiring for connecting the first sensing cells 112 with the pad portion 107. The wiring including the first transparent conductive pattern 158 and the first wiring pattern 123 may have a double layered structure, so that the wiring may have a relatively low electrical resistance and may have an improved reliability.

According to present exemplary embodiment, the first wiring pattern 123 may be formed simultaneously during the process for forming the first sensing cells 112, and the first transparent conductive pattern 158 may be formed simultaneously during the process for forming the first connection pattern 152. Therefore, the process for forming the wiring may be simplified.

The foregoing is illustrative of exemplary embodiments, and is not to be construed as limiting thereof. Although a few exemplary embodiments have been described, those skilled in the art will readily appreciate that many modifications are possible in the exemplary embodiments without materially departing from the novel teachings and advantages of exemplary embodiments. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of exemplary embodiments and is not to be construed as limited to the specific embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A method of manufacturing a touch panel, the method comprising:
    forming a plurality of sensing cells in a first region of a substrate simultaneously, the plurality of sensing cells comprising:
        first sensing cells arranged in a first direction;
        a first connection pattern connecting adjacent first sensing cells in the first direction; and
        second sensing cells arranged in a second direction, and isolated from each other;
    forming a first insulating interlayer on the plurality of sensing cells;
    removing at least portion of the sensing cells and the first insulating interlayer;
    forming a second insulating interlayer on the first insulating interlayer;

removing at least a portion of the first insulating interlayer and the second insulating interlayer to form contact holes exposing the plurality of sensing cells; and forming a second connection pattern and a transparent conductive pattern on the second insulating interlayer simultaneously, wherein the second connection pattern is electrically connected to adjacent second sensing cells in the second direction through the corresponding contact holes, and the transparent conductive pattern is disposed in a second region.

2. The method of claim 1, wherein forming the second connection pattern and the transparent conductive pattern comprises:

forming a transparent conductive layer on the second insulating interlayer and inner walls of the contact holes; and performing an etching process to remove at least a portion of the transparent conductive layer.

3. The method of claim 2, further comprising forming a metal pattern in the second region and on the transparent conductive pattern.

4. The method of claim 3, wherein forming the metal pattern comprises:

forming a metal layer on the transparent conductive layer;

forming a photoresist pattern on the metal layer;

removing at least a portion of the metal layer and the transparent conductive layer using the photoresist pattern as an etching mask.

5. The method of claim 4, wherein forming the photoresist pattern comprises:

forming a photoresist layer on the metal layer;

performing an exposure process using a halftone mask or a slit mask;

removing at least a portion of the photoresist layer to form the photoresist pattern comprising a first thickness portion and a second thickness portion, wherein the first thickness portion and the second thickness portion have different thicknesses.

6. The method of claim 5, wherein the first thickness portion is disposed in the first region, the second thickness portion is disposed in the second region, and the thickness of the second thickness portion is greater than the thickness of the first thickness portion.

7. The method of claim 1, wherein forming the plurality of sensing cells comprises:

forming a metal nanowire layer on the substrate, the metal nanowire layer comprising a plurality of metal nanowires that are arranged to form an irregular network; and removing at least a portion of the metal nanowire layer to form the plurality of sensing cells.

8. The method of claim 7, wherein forming the plurality of sensing cells further comprises forming a wiring connection pattern in the second region on the substrate, wherein the wiring connection pattern is electrically connected to the transparent conductive pattern through the corresponding contact holes.

9. The method of claim 7, wherein forming the plurality of sensing cells further comprises forming a wiring pattern in the second region on the substrate, wherein the transparent conductive pattern overlaps the wiring pattern.

10. The method of claim 9, further comprising a pad portion in the second region on the substrate, wherein the wiring pattern directly contacts the pad portion.

* * * * *